(12) United States Patent
Kim

(10) Patent No.: US 7,679,979 B1
(45) Date of Patent: Mar. 16, 2010

(54) HIGH SPEED SRAM

(75) Inventor: Juhan Kim, San Jose, CA (US)

(73) Assignee: Fronteon Inc, San Jose, CA (US)

( * ) Notice: Subject to any disclaimer, the term of this patent is extended or adjusted under 35 U.S.C. 154(b) by 70 days.

(21) Appl. No.: 12/202,263

(22) Filed: Aug. 30, 2008

(51) Int. Cl.
*G11C 7/00* (2006.01)

(52) U.S. Cl. .................. 365/205; 365/154; 365/203; 365/207

(58) Field of Classification Search .............. 365/154, 365/203, 205, 207
See application file for complete search history.

(56) References Cited

U.S. PATENT DOCUMENTS

| | | | |
|---|---|---|---|
| 5,179,033 A | | 1/1993 | Adan |
| 5,751,648 A | * | 5/1998 | Braceras et al. ............. 365/205 |
| 5,780,910 A | | 7/1998 | Hashimoto et al. |
| 6,205,049 B1 | | 3/2001 | Lien et al. |
| 6,426,905 B1 | * | 7/2002 | Dennard et al. ............. 365/204 |
| 6,442,089 B1 | | 8/2002 | Fletcher et al. |
| 6,456,521 B1 | * | 9/2002 | Hsu et al. .................... 365/149 |
| 6,956,779 B2 | * | 10/2005 | Tran ........................... 365/205 |
| 6,972,450 B2 | | 12/2005 | Liaw |
| 7,158,428 B2 | | 1/2007 | Fujimoto |
| 7,551,474 B2 | * | 6/2009 | Kim ............................ 365/149 |
| 7,577,051 B1 | * | 8/2009 | Kim ............................ 365/205 |
| 7,626,848 B2 | * | 12/2009 | Kim ............................ 365/149 |

OTHER PUBLICATIONS

A Low Power Embedded SRAM for Wireless Applications, IEEE Solid-States Circuits, vol. 42, No. 7, Jul. 2007.
A low power SRAM Using Hierarchical Bit Line and Local read amplifiers, Yang et al, IEEE Journal of Solis-State Circuits, vol. 40, No. 6, Jun. 2005.

* cited by examiner

*Primary Examiner*—Richard Elms
*Assistant Examiner*—Eric Wendler

(57) ABSTRACT

High speed SRAM is realized such that a first dynamic circuit serves as a local sense amp for reading a memory cell through a lightly loaded local bit line, a second dynamic circuit serves as a segment sense amp for reading the local sense amp, and a tri-state inverter serves as an inverting amplifier of a global sense amp for reading the segment sense amp. When reading, a voltage difference in the local bit line is converted to a time difference for differentiating low data and high data by the sense amps for realizing fast access with dynamic operation. Furthermore, a buffered data path is used for achieving fast access and amplify transistor of the sense amps is composed of relatively long channel transistor for reducing turn-off current. Additionally, alternative circuits and memory cell structures for implementing the SRAM are described.

20 Claims, 9 Drawing Sheets

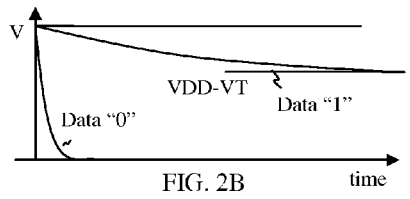
FIG. 2B
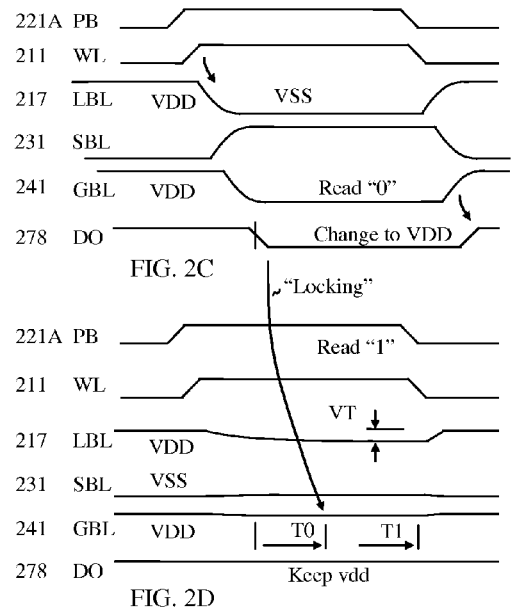
FIG. 2C
FIG. 2D
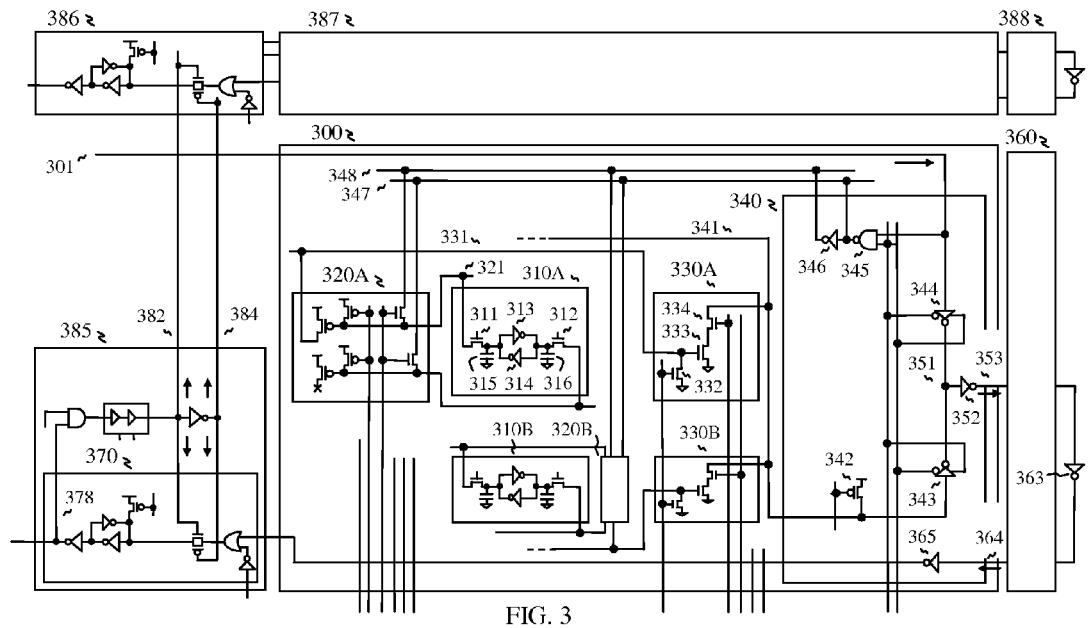
FIG. 3

Truth table

| nsdata | sdata | cdata | ncdata | Match line | Result | |
|---|---|---|---|---|---|---|
| 0 | 0 | x | x | High | Match | T31 |
| 1 | 0 | 1 | 0 | Low | Mis-match | T32 |
| 1 | 0 | 0 | 1 | High | Match | T33 |
| 0 | 1 | 1 | 0 | High | Match | T34 |
| 0 | 1 | 0 | 1 | Low | Mis-match | T35 |

T21 T22 T23 T24 T25 T26

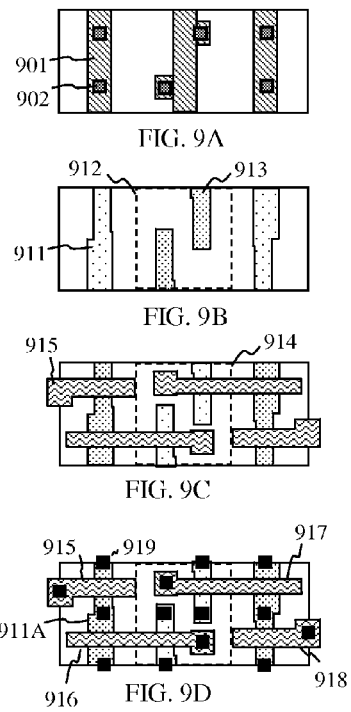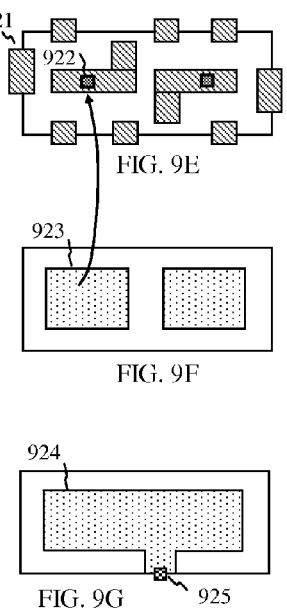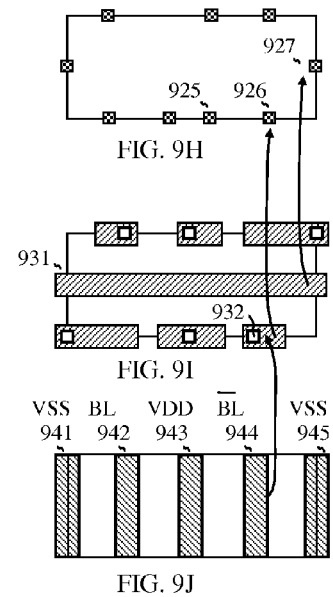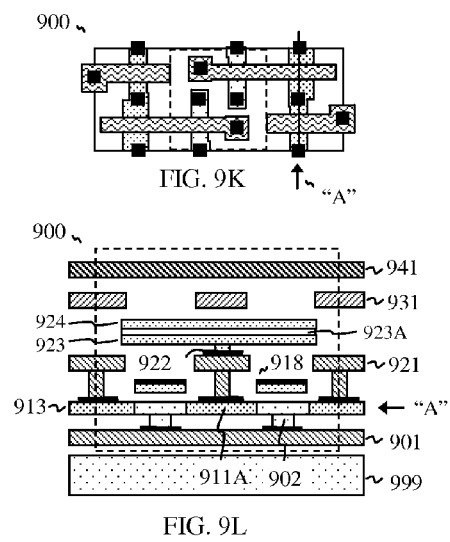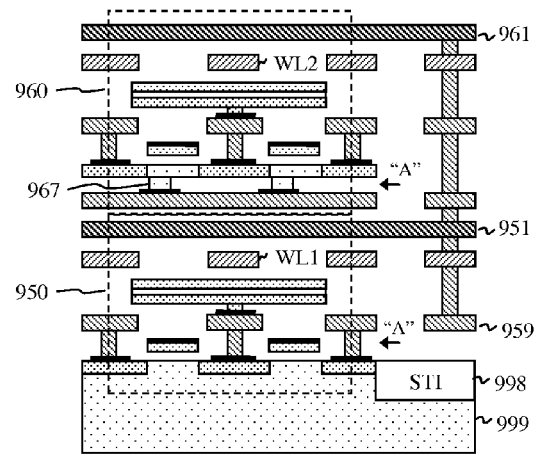

HIGH SPEED SRAM

FIELD OF THE INVENTION

The present invention relates generally to integrated circuits, in particular to high speed SRAM (Static Random Access Memory).

BACKGROUND OF THE INVENTION

For its high-speed and short cycle time, the SRAM (Static Random Access Memory) is utilized extensively as a cache memory in computer systems and network systems. Furthermore, the SRAM is simple to use with no refresh operation. As such, the SRAM constitutes a key component that holds sway on the speed and performance of the computer systems and other systems. Efforts of research and development have been under way primarily to boost the operating speed of the memory.

FIG. 1 illustrates a circuit diagram of a conventional SRAM including memory segment, a write circuit and a sense amplifier, as published, U.S. Pat. No. 4,712,194 and No. 6,075,729. The memory block 100 includes memory cells 110, 111, 112 and 113 having six transistors. The memory cells are connected to bit lines 121, 122, 123 and 124, which bit lines are pre-charged by pre-charge circuits 125 and 126, respectively. During standby, the pre-charge circuits 125, 126 and 127 preset the bit lines to high. After then, the bit lines are released from the pre-charge state when read and write. Thus the stored voltage of the memory is transferred to the sense amp 160 through transfer gates. When the memory cell 110 is selected, the transfer gates 141 and 142 are turned on, while the other transfer gates 143 and 144 keep turn-off state. In doing so, the memory cell data is read by the sense amp 160 through the common bit lines 151 and 152. The read output of the sense amp 160 is transferred to output node 190 through a transfer gate 161, while unselected memory block 170 and unselected sense amp 180 are in pre-charge state and transfer gate 181 keeps turn-off state. When write, write buffers 131 and 132 transfer input data to write circuit 133, so that the input data is transferred to the memory cell through bit lines when word lines of the memory cell are asserted to high.

In the conventional SRAM, six-transistor memory cell 110 is used to store data, such that a latch including two cross coupled inverters stores voltage data. In order to achieve fast access, the latch of the memory cell should be strong enough to drive heavily loaded bit line, but the latch should be weak enough to be flipped by the write circuit 133 through the transfer gates 141 and 142. Furthermore, heavily loaded bit lines may flip unselected memory cells during read and write operation. For example, the unselected memory cell 112 receives same word line voltage as that of the selected memory cell 110, so that the memory cell 112 will lose its data when the latch is too weak and the bit line loading is too heavy because both bit lines 123 and 124 are floating from pre-charged high voltage, while the selected bit line 121 and 122 receive input data from write circuit 133. And the pass (transfer) transistor of the memory cell should be strong enough to transfer charges for reading and writing. As a result, the transistors in the memory cell are bigger than minimum feature size within the fabrication process limit typically, which increases the chip area.

For writing data, a write data line pair 134 and 135 is connected to the write circuit 133 and another memory block 170. Conventionally, the write data line pair is heavily loaded with no buffers, so that the write data lines always drive full length of the memory block, which increases driving current and RC delay time. For reading data, a read data line 190 is connected to sense amps 160 and 180. Alternatively, a pair of read data lines can be used typically for amplifying a voltage difference. Thus, access time is different from location of the selected sense amp. For example, access time from the sense amp 160 is faster than that of the sense amp 180, so that it is difficult to latch sense amp output at high speed because a latching clock is fixed (not shown). Furthermore, the read data line is also heavily loaded for connecting to multiple memory blocks with no buffers, which increases driving current and RC delay time as well.

There are many efforts to improve the conventional SRAM with new circuit concepts, such that memory array is multi-divided in order to reduce parasitic loading of bit line by introducing hierarchical bit line architecture and multi-stage sense amp, as published U.S. Pat. No. 7,158,428 and U.S. Pat. No. 6,442,089. However, each memory segment including the bit line comprises more circuits such as a cross-coupled keeper transistor circuit, a local read amplifier circuit, pre-charge transistors, and transfer transistors, which increases chip area. And another prior art is shown, "A Low Power Embedded SRAM for Wireless Applications", IEEE Solid-States Circuits, Vol. 42, No. 7, July 2007. In this prior art, bit lines are multi-divided but sense amps include more transistors, so that the area may be increased, and write circuit is increased as well. And one more prior art is shown, "A low power SRAM Using Hierarchical Bit Line and Local read amplifiers", Yang et al, IEEE Journal of Solis-State Circuits, Vol. 40, No. 6, June 2005, such that the local read amplifier improves write operation, but it does not improve read operation because the local read amplifier is not activated during read cycle. As a result, the access time is still slow and area may be increased more.

Furthermore, in the bulk CMOS SRAM, the current driving ability of the load MOS transistors drops if the miniaturization of the memory cell size further advances. If the operation voltage further drops, the amount of charge stored in the storage node drops, so that the potential fluctuation of the storage node due to alpha rays cannot be suppressed, deteriorating the soft error resistance. There are some improvements with capacitor in the memory cell, as published in U.S. Pat. No. 6,972,450, U.S. Pat. No. 5,780,910 and U.S. Pat. No. 5,179,033. However, these approaches solve only memory cell portion, but they don't suggest any new improvements with peripheral circuits such as sense amps, in order to miniaturize the memory cell.

In this respect, there is still a need for improving the static random access memory. In the present invention, high speed SRAM is realized such that bit lines are multi-divided to reduce the parasitic capacitance of the bit line, which realizes high speed write and read operation. For reading the divided bit line more effectively, multi-stage sense amps are used, such that a first dynamic circuit as a local sense amp is connected to memory cells through two local bit lines, a second dynamic circuit as a segment sense amp is connected to the local sense amp through a segment bit line, and a tri-state inverter is connected to the segment sense amp through a global bit line. With dynamic sense amps, penetration current is reduced during sensing, which realizes low power consumption. Furthermore, low voltage operation is available with dynamic circuits because the dynamic circuit detect whether an amplify transistor is turned on or not by a selected memory cell. And with the multi-stage sense amps, a time-domain sensing scheme is realized in order to differentiate low voltage data and high voltage data in the time-domain, which does not require the conventional sense amp, because the multi-stage sense amps convert a voltage difference of the bit line to a current difference, and then the current difference is converted to a time difference. Furthermore, a buffered data path is used for realizing fast write and read operation. Furthermore, the lightly loaded bit line does not disturb the unselected cells when writing and reading. Additionally the SRAM cell includes a stacked capacitor for preserving charges, which increases alpha ray immunity.

The memory cell can be formed on the surface of the wafer. And the steps in the process flow should be compatible within the current CMOS manufacturing environment. Alternatively, the memory cell can be formed from thin film polysilicon layer, because the lightly loaded bit line can be quickly discharged by the memory cell even though the thin film pass transistor can flow relatively low current. In doing so, multi-stacked memory is realized with thin film transistor, which can increase the density within the conventional CMOS process with additional process steps, because the conventional CMOS process is reached to a scaling limit for fabricating transistors on a surface of a wafer. In particular, a body-tied TFT (Thin Film Transistor) transistor can be alternatively used as the thin film transistor for alleviating self heating problem of short channel TFT. In doing so, multi-stacked SRAM is realized with short channel TFT transistor.

SUMMARY OF THE INVENTION

For realizing low power SRAM, bit lines are multi-divided so that multi-stage sense amps are used to read the memory cell through the divided local bit lines. In particular, amplifying transistors of the sense amps are composed of relatively long channel transistors than those of pre-charge transistors in order to reduce turn-off current, which reduces power consumption. Furthermore, the multi-stage sense amps are composed of dynamic circuits for eliminating penetration current when reading, wherein the multi-stage sense amps include a first dynamic circuit serving as a local sense amp for reading the memory cell through a local bit line, a second dynamic circuit serving as a segment sense amp for reading the local sense amp through a segment bit line, and a first tri-state inverter serving as an inverting amplifier of a global sense amp for reading the segment sense amp through a global bit line, while a second tri-state inverter is used for bypassing an output from a previous memory block, which configures a data transfer circuit. The dynamic circuits are also useful to reduce operating voltage for realizing low power consumption, because the dynamic circuits are turned on around threshold voltage of MOS transistor for detecting whether an amplify transistor is turned on or not. With multi-stage sense amp, access time is improved because each sense amp drives lightly loaded bit lines, such that the memory cell drives lightly loaded local bit line, the local sense amp drives the segment bit line for transferring a read output to the segment sense amp, the segment sense amp drives the global bit line for transferring the read output to the global sense amp, and the global sense amp drives a common line of the data transfer circuit for transferring the read output to an output latch circuit.

And a buffered data path is connected to the global sense amp for writing and reading a data, wherein a forwarding write line serving as a forwarding write path is used for writing, such that the forwarding write path is selected by block select signals, which realizes to reduce driving current and RC time constant, because unselected portion of the data line is not charging or discharging when writing. Furthermore, unselected portion of the data line is used as a returning read path. Thus, the returning read path receives a read output from the memory cell through multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed. Additionally, a column decoder signal is added for selecting columns in bit line direction, which realizes page mode operation.

Furthermore, configuring memory is more flexible, such that multiple memory macros can be easily configured with small segmented memory array and multi-stage sense amps, instead of big macro with the conventional sense amps. And number of sense amps can be determined by the target speed. For example, high speed application needs more segmented array with more sense amps, while high density application needs more memory cells with reduced number of sense amps, thus cell efficiency is increased.

In order to match the width of the local sense amp with the memory cell, a left local sense amp is placed on the left side and a right local sense amp is placed on the right side. And the segment sense amps are also fit with the local sense amp. One of prime advantages is that the local sense amp occupies small area with six to eight transistors, and the segment sense amp is even smaller than the local sense amp with three transistors only. And write circuits are included in the local sense amp. And the global sense amp is shared by eight columns, and also data transfer circuit is included in the global sense amp. As a result, the chip area is reduced by replacing the conventional sense amp with multi-stage sense amps. In contrast, conventional architecture needs more area for adding differential amplifier. And the differential amplifier occupies more space for connecting common nodes of cross coupled transistor pairs which require a balance for matching threshold voltage with non-minimum transistors. Furthermore, the local sense amp has high gain with wider channel MOS transistor than that of the memory cell, and the segment sense amp has higher gain than that of the local sense amp, which realizes fast read operation.

Furthermore, with light bit line architecture, bit lines are multi-divided into short local bit lines to reduce parasitic loading. Thus the local bit line is lightly loaded. In doing so, the light bit line is quickly charged or discharged when reading and writing, which realizes fast operation. When reading, a stored data in a memory cell is transferred to an output latch circuit through multi-stage sense amps such that low data is transferred to the output latch circuit with high gain, but high data is not transferred with low gain. By the sense amps, a voltage difference in the bit line is converted to a time difference as an output of the global sense amp with gain. In this manner, a time-domain sensing scheme is realized to differentiate low data and high data stored in the memory cell. For instance, low data is quickly transferred to an output latch circuit through the sense amps with high gain, but high data is rejected by a locking signal based on high data as a reference signal.

More specifically, a reference signal is generated by one of fast changing data with high gain from reference cells, which signal serves as a reference signal to generate the locking signal for the output latch circuit in order to reject latching another data which is slowly changed with low gain, such that low voltage data is arrived first while high voltage data is arrived later, or high voltage data is arrived first while low voltage data is arrived later depending on configuration. The time-domain sensing scheme effectively differentiates low voltage data and high voltage data with time delay control, while the conventional sensing scheme is current-domain or voltage-domain sensing scheme. In the convention memory, the selected memory cell discharges the bit line, and the discharged voltage of the bit line is compared by a comparator which determines an output at a time. In the present invention, there are many advantages to realize the time-domain sensing scheme, so that the sensing time is easily controlled by a tunable delay circuit, which compensates cell-to-cell variation and wafer-to-wafer variation, such that there is a need for adding a delay time before locking the output latch circuit with a statistical data for all the memory cells, such as mean time between fast data and slow data. Thereby the tunable delay circuit generates a delay for optimum range of locking time. And the read output from the memory cell is transferred to the output latch circuit through a returning read path, thus the access time is equal regardless of the location of the selected memory cell, which is advantageous to transfer the read output to the external pad at a time.

When writing, the latch of the memory cell should be weak enough to be flipped by the write circuit through the write transfer gate, and the latch of the memory cell should be strong enough to drive the bit line when reading. For example, when a word line is asserted to high, a selected memory cell may lose its data when the memory cell is too weak and the bit line loading is too heavy because the charges from the bit line is injected to the storage node of the memory cell. However, in the present invention, the activated memory cell is not disturbed or less disturbed by the bit line because loading of the bit line is very light.

Furthermore, the memory cell includes one or two stacked capacitors for preserving charges, which prevents wrong flip when writing, discharges the bit line when reading, and increases alpha ray immunity with preserving the charges in the storage node. The capacitor is stacked on the memory cell, which does not increase memory cell area. And various capacitors can be used as the capacitor for the memory cell to keep the storage charges, such as the capacitor structure includes PIP (Polysilicon-Insulator-Polysilicon) capacitor and MIM (Metal-Insulator-Metal) capacitor. Furthermore, various insulators can be used for forming the capacitor, such as silicon dioxide, silicon nitride, Ta2O5, TiO2, Al2O3, TiN/HfO2/TiN(TIT), and Ru/Insulator/TiN(RIT).

Furthermore, the current flow of the transistors in the memory cell can be reduced because the transistors only drive a lightly loaded bit line, which means that the transistors can be miniaturized further. Moreover, the present invention realizes multi-stacked memory cell structure including thin film transistor, because the memory cell only drives lightly loaded bit line even though thin film polysilicon transistor can flow lower current, around 10 times lower, for example. In particular, body-tied TFT is used to form a memory cell, for alleviating self heating problem in short channel thin film transistor, which realizes to miniaturize the memory cell, more effectively. The TFT transistor can be used as pull-up transistor in the memory cell. Alternatively, the TFT transistors are used as transistors in a whole memory cell including pass transistor and cross coupled inverter latch. And the memory cell can be formed from various semiconductor materials, such as single crystalline silicon, polycrystalline silicon, silicon-germanium and germanium.

Furthermore, various alternative configurations are described for implementing the multi-stage sense amps, and an example application for content addressable memory is described as well. And, example memory cell layout and cross sectional views are illustrated to minimize cell area. Still furthermore the fabrication method is compatible with the conventional CMOS process, but additional steps are required to form body-tied TFT transistor for configuring the memory cell.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIGS. 2B, 2C and 2D illustrate timing diagrams for the related the SRAM, according to the teachings of the present invention.

FIG. 3 illustrates a column decoding scheme of the invented SRAM, according to the teachings of the present invention.

FIG. 9A, 9B, 9C, 9D, 9E, 9F, 9G, 9H, 9I and 9J illustrate an example of memory cell layout, FIG. 9K illustrates base layers for explaining a cross sectional view of the related memory cell, and FIG. 9L illustrates a cross sectional view of the related memory cell, FIG. 9M illustrates a cross sectional view including two stacked memory cells.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
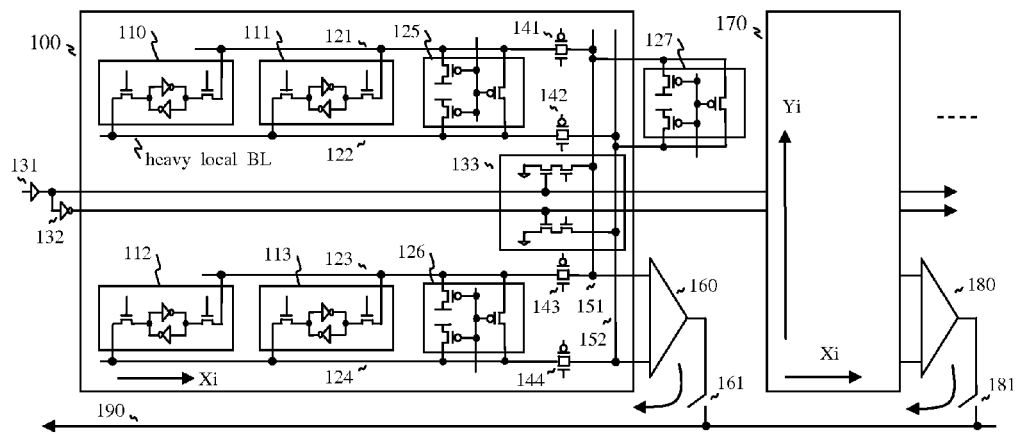
FIG. 1 illustrates the static random access memory, as a prior art.
Figure 2A:
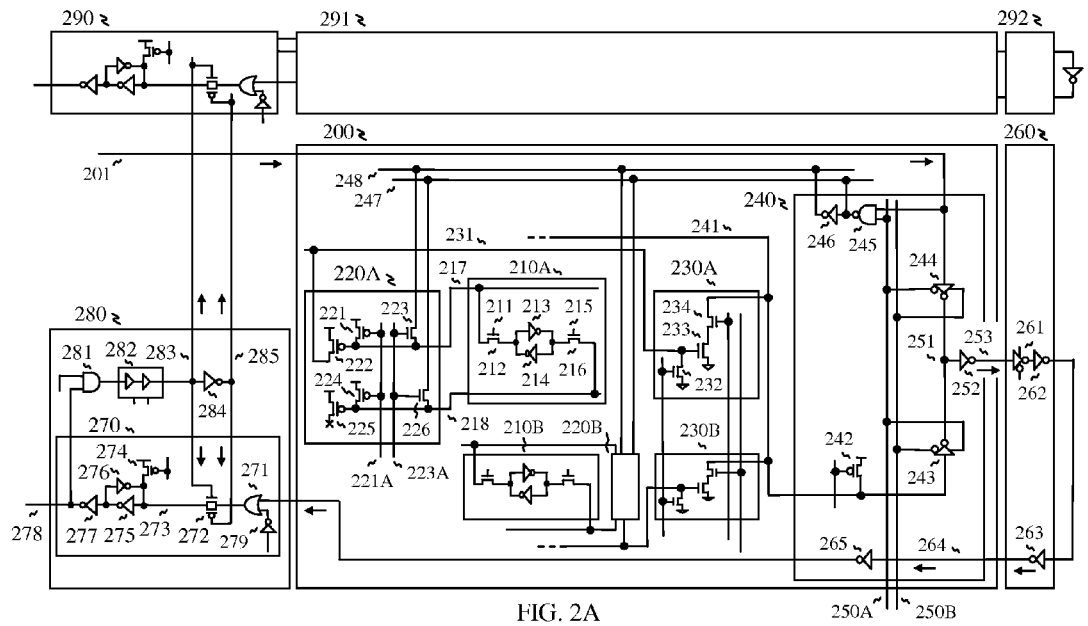
FIG. 2A illustrates SRAM including a buffered data path.

The present invention is directed to high speed SRAM as shown in FIG. 2A, wherein a memory block 200 comprises memory cells 210A and 210B, a left local sense amp 220A, a right local sense amp 220B, segment sense amps 230A and 230B, and a global sense amp 240. The memory cell 210A is composed of two pass transistors and a cross coupled inverter latch, the pass transistors 212 and 216 are controlled by a word line 211, and the cross coupled inverter latch including two inverters 213 and 214 are connected to the pass transistors through two local bit lines 217 and 218, wherein the local bit line 217 is non-inverting bit line and the other the local bit line 218 is inverting bit line.

The bit lines are multi-divided for reducing parasitic capacitance, such that length of the bit line is shorter than that of conventional circuit. For instance, bit line loading is half, one-fourth, or one-eighth, compared with the conventional memory. However, by dividing the bit line into short lines, more sense amps are required. Thus, each sense amp should be small enough for inserting between the divided memory arrays. To do so, multi-stage sense amps are used for reading the memory cell such that the left local sense amp in the left hand side 220A is connected to the two local bit lines 217 and 218 from left hand side, and the right local sense amp 220B in the right hand side is connected to another memory cell 210B through another bit line pair, the segment sense amp 230A is connected to the left local sense amp 220A through a segment bit line 231, the segment sense amp 230B is connected to the right local sense amp 220B, and the global sense amp 240 receives an output from one of segment sense amp 230A and 230B through a global bit line 241.

The local sense amp 220A is composed of six transistors, wherein a pre-charge transistors 221 for pre-charging the (non-inverting) local bit line 217 and another pre-charge transistors 224 for pre-charging the inverting local bit line 218, a write transistor pair 223 and 226 for writing data through a write bit line pair 247 and 248, and a local amplify transistor 222 for reading the local bit line 217 while another amplify transistor 225 is used only for compensating gate capacitor to the inverting local bit line 218, which matches bit line loading with the local bit line 217, where drain of the transistor 225 is floating. The local sense amp 220A is connected to the memory cell 210A from left side, and another local sense amp 220B is connected to memory cell 210B from right side for matching pitch of the local sense amp with a memory cell. Thus, pitch of each local sense amp is same as pitch of the memory cell, because there is enough space for drawing six transistor local sense amp next to six transistor memory cell.

The segment sense amp 230A is composed of three transistors, wherein a reset transistor 232 for resetting the segment bit line 231, a segment amplify transistor 233 for reading the segment bit line 231, and a segment select transistor 234 for enabling the segment amplify transistor 233.

The global sense amp 240 is composed of a write circuit 245, a read circuit, a bypass circuit and a returning buffer. More specifically, the write circuit is composed of a receiving gate 245 and an inverting gate 246, such that the receiving gate 245 is connected to a forwarding write line 201 serving as a forwarding write path, and the inverting gate 246 receives an output from the receiving gate. For writing, the two local bit lines are driven by the receiving age and the inverting gate through a write bit line pair 247 and 248. The read circuit is composed of a reset transistor 242 for resetting the global bit line 241 and a first tri-state inverter 243 serving as an inverting amplifier. The bypass circuit is composed of a second tri-state inverter 244 and a read inverter 252, and the returning buffer 265 is used for buffering a returning read line 264, so that the global sense amp occupies 2~3 transistors per eight columns while total 19 transistors are used for configuring the global sense amp. And an output of the first tri-state inverter 243 is connected to a common node 251. And the second tri-state inverter 244 includes an input connecting to the forwarding write line 201 for bypassing previous block output, and an output connecting to the common node 251 for receiving a read output from the memory cell, such that the second tri-state inverter 244 is disabled by block select signals 250A (high) and 250B (low) for the selected memory block, while unselected (bypass) tri-state inverter 261 in unselected memory block 260 is turned on to bypass an output from the previous block 200 but unselected first tri-state inverter (not shown) is turned off. The read inverter 252 transfers an inverted output of the common node 251 to a forwarding read line 253. And the forwarding read line 253 is connected to a returning read path including multiple inverting buffers, 261 and 262, and the returning buffer 263 and 265, wherein the returning buffer 265 is connected to the returning read line 264.

By disabling the second tri-state inverter 244 in the selected memory block 200, data path is divided into the forwarding write path and the returning read path, which realizes to reduce RC time constant and driving current, because data line is divided into short line while unselected portion of the data line is not discharging when writing. Furthermore, unselected portion of the data line is used as a read data line which is the forwarding read line 253. Thus, the forwarding read line 253 receives the read output from a memory cell through multi-stage sense amps. And the read output is also buffered and connected to the data output latch 270 through multiple buffers and the returning read line 264. With the returning read path, access time is almost same regardless of selected memory cell location, which realizes to latch the read output at a time with enough set-up and hold time even though a latch clock is fixed.

In order to reduce chip area, multiple memory cells are connected to one local sense amp through the local bit line pair, multiple local sense amps are connected to one segment sense amp through the segment bit line, and also multiple segment sense amps are connected to one global sense amp through the global bit line. In this manner, the first dynamic circuit serves as the local sense amp 220A which drives the segment bit line 231 as a capacitive load. And a second dynamic circuit serves as the segment sense amp 230A which drives the global bit line 241 as a capacitive load. The global sense amp 240 serves as a third sense amplifier which includes the first tri-state inverter 243 as the inverting amplifier for receiving the global bit line 241 and driving the (lightly loaded) common node 251 which is connected to the read inverter 252. And the read inverter is also connected to the second tri-state inverter 244 for bypassing an output from a previous memory block or a write data. Hence, there is no high penetration current when sensing with two dynamic circuits serving as the local sense amp and the segment sense amp, and the first tri-state inverter serving as the global sense amp, while the conventional differential amplifier as a sense amp wastes penetration current because pull-up transistor and pull-down transistor are simultaneously turned on until a sense amp output is developed to a full level.

For reading a data from the memory cell 210A, the left local sense amp 220A is released from pre-charge state, such that the pre-charge transistor 221 is turned off to release the non-inverting local bit line 217, another pre-charge transistor 224 is also turned off to release the inverting local bit line 218 from pre-charge state, while the write transfer transistors 223 and 226 keep turn-off state, but the inverting local bit line 218 is not read. At the same time, the right local sense amp 220B is also released from pre-charge state. And then, the memory cell 210A is selected by turning on the pass transistors 212 and 216 with the word line 211 and 215, thus the left local sense amp 220A reads the memory cell 210A. And the adjacent memory cell 210B is selected as well, so that the right local sense amp 220B reads the memory cell 210B. When the stored data is "0", the local bit line (LBL) 217 is quickly discharged to VSS (ground) voltage by the latch including inverters 213 and 214, because the local bit line 217 is lightly loaded. In other words, a weak and small latch can be used as a storage device for discharging the lightly loaded bit line when reading, which realizes to reduce memory cell area. Detailed memory cell structure will be illustrated as below.

By discharging the local bit line 217, the local amplify transistor 222 pulls up the segment bit line 231. Similarly, by charging the segment bit line 231, a segment amplify transistor 233 in the segment sense amp 230A is turned on while the reset transistor 232 is turned off. By turning on the segment amplify transistor 233, the global bit line 241 is lowered to VSS voltage when the segment select transistor 234 is turned on but the pre-set transistor 242 is tuned off. When the global bit line 241 is lowered, the common node 251 is raised to VDD voltage by the first tri-state inverter 243, while a block select signal 250A (high) and an inverted block select signal 250B (low) are asserted. Thus, the read inverter 252 receives an output from the first tri-state inverter 243. Then, the read output from the read inverter 252 is transferred to an output latch circuit 270 through the forwarding read line 253 and inverting buffers 261, 262, 263 and 265, while unselected tri-state inverter 261 in the unselected memory block 260 is turned on, in order to bypass the read output from the selected memory block 200.

In contrast, when the stored data is "1", the local bit line (BL) 221A is not discharged from pre-charged voltage (VPRE). Thereby the local amplify transistor 222 is turned off, which does not pull up the segment bit line 231. Thus the segment sense amp keeps turn-off state, and the global sense amp 240 keeps pre-set state. Hence, the read output is not changed, which is read data "1".

Particularly, in order to reduce turn-off current, the local amplify transistor 222 is composed of longer channel length transistor than that of the reset transistor 232 of the segment sense amp, the segment amplify transistor 233 is composed of longer channel length transistor than that of the pre-set transistor 242 of the global sense amp. Alternatively, the pre-charge transistors 221 and 224, the reset transistor 232 and the pre-set transistor 242 are composed of low threshold MOS transistor, such that the low threshold transistors keep the pre-charge state strongly with sub-threshold leakage current when reading data "1", because the segment bit line 231 and the global bit line 241 keep pre-charge state while the local amplify transistor 222 is turned off. In addition, the local amplify transistor and the segment amplify transistor are composed of high threshold MOS transistor, for realizing low power operation as another alternative configuration. And the local amplify transistor and the segment amplify transistor are composed of equal channel length transistor to that of the reset transistor of the segment sense amp and the pre-set transistor of the global sense amp, which equally works.

And a buffered data path is realized such that the buffered data path is composed of the forwarding write path and a returning read path, which realizes to reduce RC time constant and driving current, because data line is divided into short lines, while unselected portion of the data line is not discharging when writing. Furthermore, unselected portion of the data line is used as a read data line, which is the forwarding read line 253. Thus, the forwarding read line 253 receives the read output from a memory cell through multi-stage sense amps. And the forwarding read line is buffered and connected to the output latch circuit 270 through the returning read line 264 and the returning buffer 265. With the returning read path, access time is almost same regardless of selected memory cell location, which realizes to latch the read output at a time with enough set-up and hold time even though a latch clock is fixed. When writing, the forwarding write line 201 serves as a write path, such that the (decoded) write circuit including a NAND gate 245 and an inverting gate 246 is enabled by the block select signal 250A (high) for receiving a data input from the forwarding write line 201. In doing so, the write bit line pair 247 and 248 is buffered to transfer the data input to the memory cell by the write circuit. During standby, the forwarding write line 201 keeps high, for resetting the common node 251 to VSS voltage while the second tri-state inverter 244 is turned on, and all pre-charge signals and select signals are returned to pre-charge state. More detailed read operation and write operation will be explained as below.

The local amplify transistor 222 is stronger than the memory cell, and the segment amplify transistor 233 is much stronger than the local amplify transistor 222 with wide channel. Furthermore, the sense amp need not reference bit line because the sense amp does not compare voltage or current with reference bit line, but the sense amp detects whether the local amplify transistor 222 is turned on or not by the selected memory cell through the local bit line. Or the sense amp detects whether the local amplify transistor 222 is strongly or weakly turned on by the selected memory cell. Additionally, the local amplify transistor 222 and the segment amplify transistor 233 can include a low threshold MOS transistor, which achieves fast read operation for only high speed applications, even though turn-off current is increased. And the global sense amp 240 transfers the read output to the output latch circuit 270 through the read path. After then, the output latch circuit determines the read output whether the transferred data is "0" or "1" with a reference signal which is generated by data "0" because data "0" is reached to the output latch circuit early while data "1" is reached later. In this manner, the configuration of the memory block is simpler than the conventional sense amplifier using differential amplifier, while the conventional sense amplifier needs wide and long channel transistors for matching input transistors and load transistors in order to compensate device mismatch and process variation.

In the output latch circuit 270, the read output (data "0") changes the latch node 273 and output 278 to low from high through an OR gate 271 because the latch node 273 is pre-charged to high by PMOS 274 and the OR gate 271 with an inverter 279. After then, the read output is stored in the latch node 273 with cross coupled inverters 275 and 276. And the output 278 changes AND gate 281 to low, so that the transmission gate 272 is locked by signal 283 and 285 which are transferred from the output 278 through a tunable delay circuit 282 and inverter 284. Simultaneously, main data latch circuits 290 is also locked by the signal 283 and 285, where output latch circuit 290 is composed of same circuit as the output latch circuit 270. In doing so, the output 278 serves as a reference signal, which is generated by the reference memory cells, such as the memory cell 210A which store low voltage data in the (non-inverting) storage node. Adding delay circuit 282, the reference signal serves as a locking signal, where the delay circuit is tunable for differentiating low voltage data and high voltage data, more effectively, because low voltage data is arrived earlier while high voltage data is arrived later or not arrived. Thus, one of two data is arrived earlier than the other data because of inversion state of the local amplify transistor 222, so that one data is referred to as fast data and the other data is referred to as slow data.

Thus, the output latch circuit 270 and the delay circuit 282 configure a latch control circuit 280, in order to generate the locking signal. More detailed delay circuit will be explained as below (in FIG. 7A). And the AND gate 281 is used to generate the data output 278 as the reference signal even though one of reference cells is failed, where more than one reference column is added for configuring the memory block even though the drawing illustrates only one reference memory column 200 including the output latch circuit 270. Alternatively, drain node of the segment amplify transistor 233 of the segment sense amp 230A is connected (not shown) to another drain node of another segment sense amp 230B for bypassing one of two decoder where the memory column 200 serves as a reference memory block, so that the reference signal is generated as long as one of two memory cells works. In this manner, fast data from the main memory block 291 is stored to the output latch circuit 290 before the locking signals 283 and 285 lock the latch, while slow data are not latched. Furthermore, the read access time is faster than that of the conventional memory, such that multi-divided bit line architecture is introduced in order to reduce the parasitic capacitance of local bit line. As a result, the sensing scheme including the locking signal is referred to as a "time-domain sensing scheme" with the multi-stage sense amps and the locking signal.

And during write operation, a transfer gate 223 and 226 are turned on by write control signal 223A for overwriting data input 201 to the selected memory cell 210A through the write bit line pair 247 and 248 while the receiving gate 245 is enabled by the block select signal 250A (high) and the inverting gate 246 receives an output of the receiving gate. Thus, a data input is transferred to the memory cell through the write bit line pair and the forwarding write line 201. In doing so, the write bit line pair 247 and 248 is buffered and decoded for the selected block 200, which reduces unnecessary charging and discharging current for unselected blocks during write operation. When the memory block 200 is selected, other unselected data line is used as the read path, such that the second tri-state inverter 244 is disabled while the read inverter 253 is used as read path which transfers the read output from the memory cell to the output latch circuit 270 through the returning read line 264 and the inverting buffers 261, 262, 263 and 265.

While the write transfer gates 223 and 226 in the local sense amp 220A are turned on to write data, the write transfer gates in the local sense amp 220B keep turn-off state, which do not overwrite the unselected (but activated by word line) memory cell 210B to keep the stored data. However, the stored data of the unselected memory cell 210B may be lost because the word line 211 and 215 is shared, when the bit line loading is too heavy or the latch in the memory cell is too weak. In order to keep the stored voltage in the unselected memory cell when activated by the same word line, bit line loading should be reduced with multi-divided bit line architecture. This means that the lightly loaded bit line does not disturb (or less disturb) the memory cell in the unselected columns. During write, the segment bit line 231 and the global bit line 241 in the read path can be discharged when writing data "0" while the reset transistor 232 is turned off, which consumes a negligible discharge current with no other affects.

Another aspect for the read operation is that the word line voltage affects the read access time, such that the word line for the selected memory cell is raised to higher than VDD+VT level in order to avoid NMOS threshold voltage drop. Hence the bit line is quickly discharged when reading data "0", which realizes fast access operation, as an alternative configuration.

Referring now to FIG. 2B in view of FIG. 2A, discharge time of the local bit line 217 is illustrated. When the storage node of the selected memory cell stores low voltage data, the local bit line 217 is quickly discharged to VSS voltage, which is data "0". On the contrary, when the storage node of the selected memory cell stores high voltage data, the local bit line 217 is very slowly discharged to VDD−VT voltage because of threshold voltage drop of the pass transistor 212, which is data "1". And there is still leakage current through unselected memory cells containing low voltage data (not shown). In order to sustain the local bit line voltage 217 near VDD voltage when reading data "1", the pre-charge transistor 217 is composed of low threshold voltage transistor, which provides sub-threshold leakage current and sustains near VDD voltage, while the write bit line 247 keeps VDD voltage during read operation, and the pass transistors are composed of slightly longer channel transistor for reducing leakage current.

Referring now to FIG. 2C in view of FIG. 2A, detailed timing diagram for reading data "0" is illustrated. To read data, the pre-charge bar (PB) signal 221A is raised to high, and the word line including 211 and 215 is raised to a predetermined voltage, or only one word line 211 is turned on. Hence the local bit line 217 is discharged by the selected memory cell 210A. By discharging the local bit line, the local amplify transistor 222 is turned on, which charges the segment bit line 231 when the reset transistor 232 is turned off. Charging the segment bit line (SBL) 231, the global bit line (GBL) 241 is pulled down near ground voltage by the segment sense amp 230A, so that the first tri-state inverter 243 as an inverting amplifier changes the common node 251 to high from low when the pre-set transistor 242 is turned off. Changing the common node 252, the forwarding read line 253 is changed by the read inverter 252 to low from high, and which output is transferred to the output node (DO) 278 through the returning read path including inverting buffers 261, 262, 263 and 265.

During read operation, there is no phase control such that the memory cell data is immediately transferred to the output node (DO) 278 through the read path. More specifically, the local amplify transistor 222 waits until the local bit line is discharged by the selected memory cell. Hence, read control is relatively simple, which also realizes fast access with lightly loaded bit line. After reading the data, all the control signals including the pre-charge bar (PB) signal 221A, the word line, and other control signals, are returned to pre-charge state or standby mode. And during standby, the data input 201 keeps high state for pre-charging the common node 251 to low state, which also establishes high output to the output node 278 before reading data "0".

Referring now to FIG. 2D in view of FIG. 2A, detailed timing diagram for reading data "1" is illustrated. When the stored data is "1", the local amplify transistor 222 in the local sense amp 220A does not provide a current to the segment bit line 231 because the local bit line (BL) 217 is not discharged for a short time by the memory cell. Thereby, the common node 251 keeps low state while the global bit line keeps pre-charge state, thus the output (DO) 278 keeps pre-charge state as well. However, the segment bit line (SBL) 231 is very slowly charged by the turn-off current through the local sense amp, and the local bit line 217 may be discharged to VDD–VT level with NMOS threshold voltage drop of the pass transistor. The leakage current depends on how many cells are connected to the bit line and how many cells store low voltage data in the storage node, because low voltage data generates leakage current while high voltage data helps to keep the pre-charge voltage. When the local bit line 217 is reached to the threshold voltage of the PMOS amplify transistor 222 by the leakage current, the PMOS amplify transistor 222 starts to pull up a gate of the segment amplify transistor 233 which pulls down the global bit line (GBL) 241 weakly. Hence, the global bit line 241 is gradually pulled down, which may change the read inverter 252. In order to avoid the false flip with the leakage current, the word line 211 and 215 can be raised to higher than VDD+VT level to avoid threshold voltage drop of the pass transistor. And for reducing turn-off current when reading data "1" and standby, the local amplify transistor is composed of longer channel length transistor than that of the reset transistor of the segment sense amp, and the segment amplify transistor is composed of longer channel length transistor than that of the pre-set transistor of the global sense amp. And the reference signal is generated by fast data (low voltage data) with delay time as shown T0, so that the timing margin T1 is defined to reject slow data (high voltage data).

In this manner, the time-domain sensing scheme can differentiate low voltage data and high voltage data within a predetermined time domain through multi-stage sense amps. For example, the time-domain sensing scheme is more useful for page mode operation, such that a word line is asserted for long time with a row address while column addresses are changed frequently. When asserting a word line for long time, low data quickly reached to the output latch circuit, which generates a locking signal. And high data is very slowly changed within the long cycle time, but the locking signal effectively rejects high data to be latched to the output latch circuit. In other words, fast cycle memory (with no page mode) does not require the locking signal which is generated by the reference signal based on reference cells, because high data is not reached to the output latch circuit within a short cycle. Thus, an enable signal from a control circuit is used to control the output latch circuit, which does not require reference cells and related circuits.

In FIG. 3, a column decoding scheme of the invented SRAM is illustrated, wherein a memory block 300 comprises memory cells 310A and 310B, a left local sense amp 320A, a right local sense amp 320B, segment sense amps 330A and 330B, and a global sense amp 340. And the memory cell 310A includes two capacitors 315 and 316 connecting to storage nodes, two pass transistors 311 and 312, and a latch including two inverters 313 and 314. In a bulk CMOS SRAM, if the operation voltage further drops, the amount of charge stored in the storage node drops, so that the potential fluctuation of the storage node due to alpha rays cannot be suppressed, deteriorating the soft error resistance. In order to improve alpha ray immunity, capacitors are added to the memory cell for preserving charges, which increases alpha ray immunity, realizes fast read operation and protects the storage node with charges during write operation.

When reading data "0", the bit line 321 is discharged by the selected memory cell 310A. By discharging the bit line, the segment bit line 331 is charged to VDD voltage, where the local sense amp 320A is composed of same circuit as shown 220A in FIG. 2A. Charging the segment bit line 331, the global bit line 341 is pulled down by the segment sense amp 330A when the segment select transistor 334 is turned on but the reset transistor 332 is turned off. By discharging the global bit line 341, a common node 351 is raised near VDD voltage by the first tri-state inverter 343, while a pre-set transistor 342 is turned off and the second tri-state inverter 344 is turned off. Raising the common node 351 near VDD voltage, a forwarding read line 353 receiving a read output of the read inverter 352 is changed to low from high, and which output is transferred to output node (DO) 378 through the returning read path including inverting buffers 363 and 365, and the returning read line 364, where unselected memory block 360 is bypassed because the second tri-state inverter 361 in the unselected block is turned on. And the output 378 in the latch control circuit 385 serves as a reference signal to generate the locking signals 382 and 384, which locks main memory block 387 and 388. In this manner, fast data from the main memory block 387 and 388 are stored to the main output latch circuit 386 before the locking signals 382 and 384 lock the latch. In contrast, when reading data "1", slow data are not latched after the locking signals 382 and 384 lock the main output latch circuit 386.

When writing data, a write data is transferred to the memory cell through write bit line 347 and 348 because a write data through the forwarding write line 301 is bypassed through a receiving gate (NAND) 345 and an inverting gate 346. And the write transistor in the local sense amp and the pass transistor in the memory cell are also turned on in order to write as explained above in FIG. 2A.

Figure 4A:
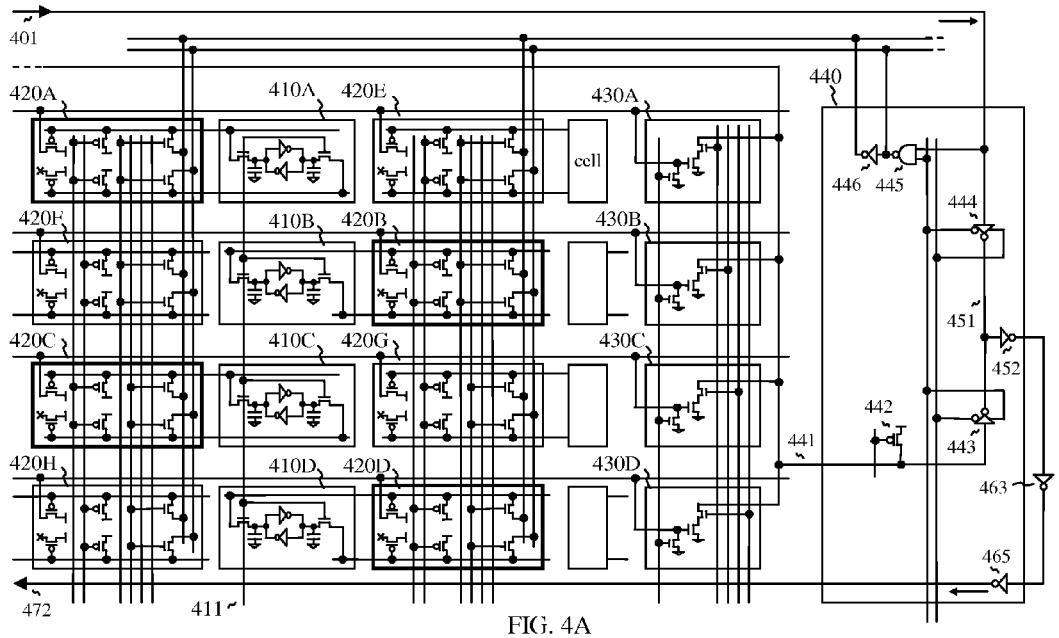
FIG. 4A illustrates detailed column decoding scheme of the related circuit.

In FIG. 4A, more detailed column decoding scheme of the memory block (300 shown in FIG. 3) is illustrated, wherein left local sense amps 420A and 420C are connected to memory cell 410A and 410C, right local sense amps 420B and 420D are connected to memory cells 410B and 410D, respectively. And unselected local sense amps 420E, 420F, 420G and 420H are also connected to memory cells in the similar manner. When a word line 411 is asserted to a predetermined voltage, those memory cells 410A, 410B, 410C and 410D are activated, but only one memory cell is read, such that one of four segment sense amps 430A, 430B, 430C and 430D is selected and a read output from the selected segment sense amp is transferred to a global sense amp 440 through the global bit line 441. And the read output from the selected global sense amp is transferred to data output node 472 through the first tri-state inverter 443, while the pre-set transistor 442 and the second tri-state inverter 444 are turned off. Hence, the read inverter 452 receives a read output from the first tri-state inverter 443 through the common node 451. The read output is transferred to data output node 472 through inverting buffers 463 and 465, and the returning read line. When writing, a write data 401 is transferred to a selected memory cell through the write circuit including a receiving gate 445 and an inverting gate 446 where the (decoded) write circuit reduces charging and discharging current, because only selected block is enabled for writing.

Figure 4B:
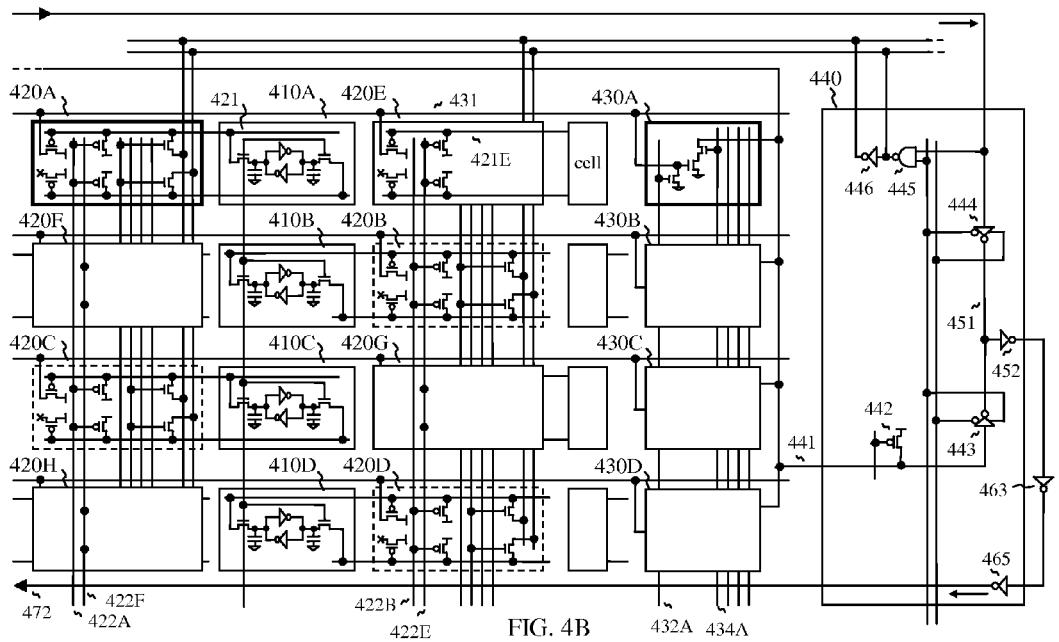
FIG. 4B illustrates a read path.

Referring now to FIG. 4B in view of FIG. 4A, detailed read path is illustrated. When four memory cells 410A, 410B, 410C and 410D are activated by a word line, four local sense amps 420A, 420B, 420C and 420D are also activated after de-asserting pre-charge control signals 422A and 422B to high, but other unselected four local sense amps 420E, 420F, 420G and 420H keep pre-charge state with pre-charge control signals 422E and 422F to low. In doing so, the segment bit line 431 is used to transfer a read output to the segment sense amp 430A from the selected local sense amp 420A, for example, while the unselected local sense amp 420E is turned off by a local bit line 421E at high state. Similarly, a read output from the selected local sense amp 420B is transferred to the segment sense amp 430B, a read output from the selected local sense amp 420C is transferred to the segment sense amp 430C, and a read output from the selected local sense amp 420D is transferred to the segment sense amp 430D, while the reset transistor is turned off by a reset control signal 432A. From four segment sense amps, only one segment sense amp 430A is selected by a segment select signal 434A, for instance. And then, the read output is transferred to the global sense amp 440 through the global bit line 441. When a stored data in the selected memory cell 410A is data "0", the local bit line 421 is discharged. By discharging the local bit line, the local sense amp 420A pulls up the segment bit line 431, which turns on the segment sense amp 430A. Hence, the segment sense 430A discharges the global bit line 441, which pulls up the common node 451 through the first tri-state inverter 453. By pulling up the common node 451, the read inverter 452 transfers the change to data output node 472 through inverting buffers 463 and 465.

Figure 4C:
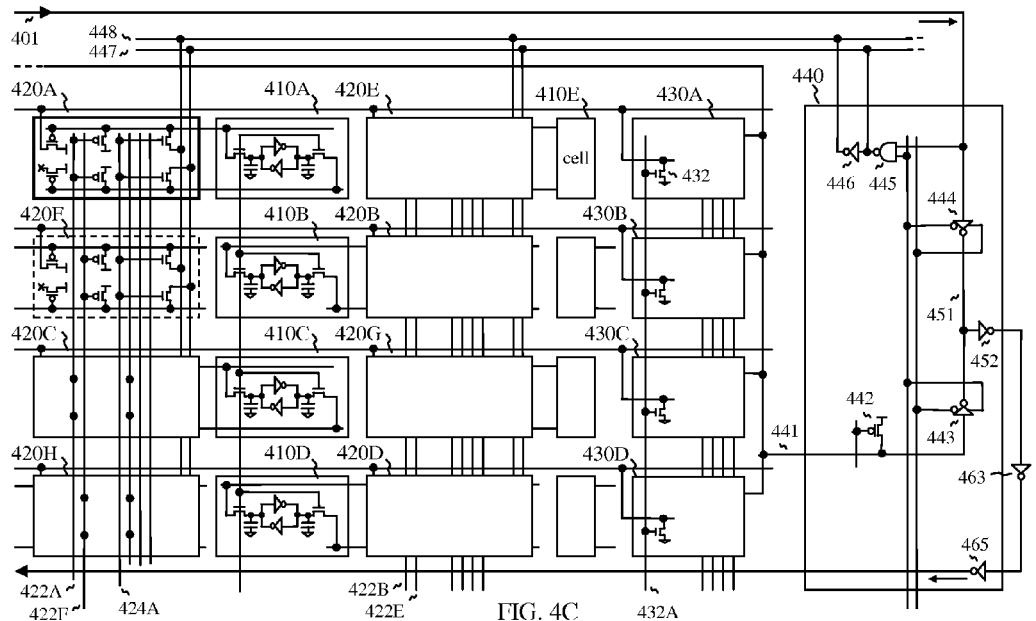
FIG. 4C illustrates a write path, according to the teachings of the present invention.

Referring now to FIG. 4C in view of FIG. 4A, detailed write path is illustrated. When four memory cells 410A, 410B, 410C and 410D are activated by a word line, eight local sense amps 420A, 420B, 420C, 420D, 420E, 420F, 420G and 420H are activated by de-asserting pre-charge control signals 422A, 422B, 422E and 422F for preventing undesired current path. But only two local sense amps 420A and 420F are enabled to transfer the write data by asserting one write control signal 424A. Thus, a write data 401 is transferred to the selected memory cell 410A through the write bit line pair 447 and 448 when the receiving gate 445 and the inverting gate 446 are enabled, and the write data 401 is transferred to another local sense amp 420F which is also enabled, because the write control gate 424A is shared, but unselected memory cells connecting to another local sense amp 420F are not activated by keeping word line to low for the unselected memory cells (not shown), so that the stored data are not changed, while other unselected six local sense amps 420B, 420C, 420D, 420E, 420G and 420H are inhibited to write by keeping turn-off state for the write transistor in the local sense amps. During write operation, the segment sense amps are not activated to turn off the segment enable transistor but the segment bit line is moving while the reset transistor 432 is turned off with a reset control signal 432A (to low) for preventing conflict. But the global sense amp 440 keeps pre-charge state while the global bit line 441 is pre-set to high with the pre-set transistor 442.

Figure 5:
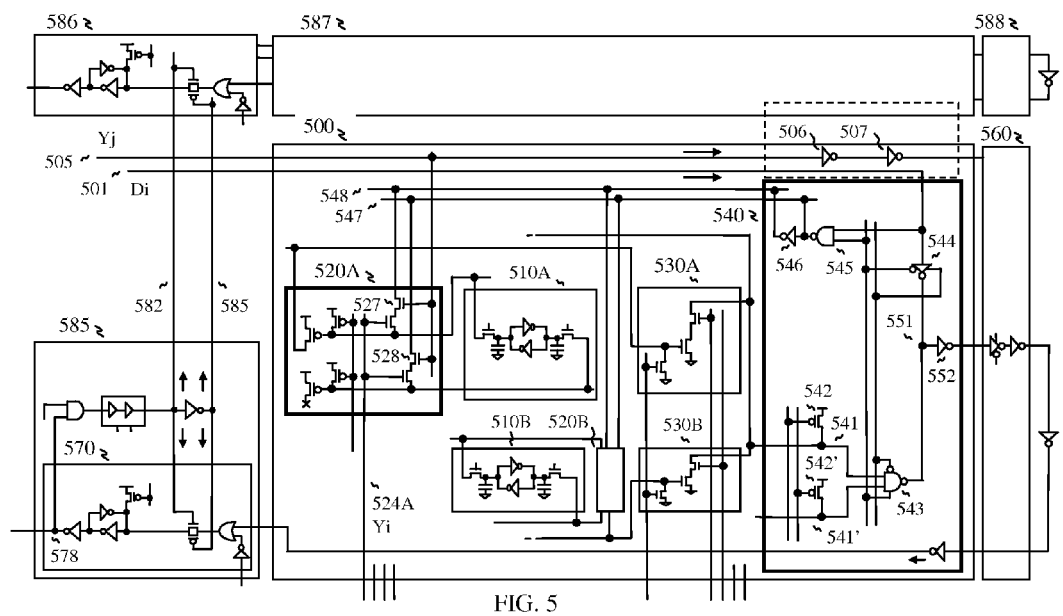
FIG. 5 illustrates alternative column decoding scheme, according to the teachings of the present invention.

In FIG. 5, alternative column decoding scheme is illustrated, wherein a memory block 500 comprises memory cells 510A and 510B, a left local sense amp 520A, a right local sense amp 520B, segment sense amps 530A and 530B, and a global sense amp 540. And there are the latch control circuit 585 to generate the locking signals 582 and 584, which lock main output latch 570 for storing data from main memory block 587 and 588. In addition, one more column decoder signal (Yj) 505 is added for "write decoding" in bit line direction, while sub-decoding signal (Yi) 524A is used for decoding one of eight columns in word line direction. And the column decoder signal 505 is buffered by two inverters 506 and 507 for next memory block, where the two inverters 506 and 507 are shared by adjacent column for reducing area. The (write) column decoder signal 505 is more flexible to select columns for big memory bank during write operation, wherein the column decoder signal 505 is connected to the local sense amps 520A and 520B, and the global sense amp 540, while other circuits are the same as FIG. 3. During read operation, data in all columns are read and transferred to the output latch circuits for page mode read operation, so that there is no additional read decoding in the memory arrays. When writing data, two series connected transistors including transistors 527 and 528 are turned on by the column decoder signal 505, such that local bit line pair 517 and 518 receive write data (Di) 501 through the write bit line pair 547 and 548 while the receiving gate 545 and the inverting gate 546 are activated.

Furthermore, in order to realize one of eight column decoding, a clocked NAND gate 543 is used for reading the global bit lines as an inverting amplifier. When reading data, one of two pre-set transistors 542 and 542' is released from the pre-set state. For example, the pre-set transistor 542 is turned off for reading a first global bit line 541 while unselected pre-set transistor 542' keeps high with turn-on state. Thus, a second global bit line 541' gives "don't care" condition for reading because it's not selected. More specifically, when reading data "0", the global bit line 541 is discharged by the segment sense amp 530A, such that the clocked NAND gate 543 detects the global bit line and transfers to the output latch circuit through the read inverter 552 and inverting buffers. And other operation is same as FIG. 3. And the output 578 in the output latch circuit 570 serves as a reference signal to generate the locking signals 582 and 584, which locks main memory block 587 and 588. In this manner, fast data from the main memory block 587 and 588 are stored to the main output latch circuit 586 before the locking signals 582 and 584 lock the latch. In contrast, when reading data "1", slow data are not latched after the locking signals 582 and 584 lock the main output latch circuit 586.

Figures 6, 7A, 7B, 7C:
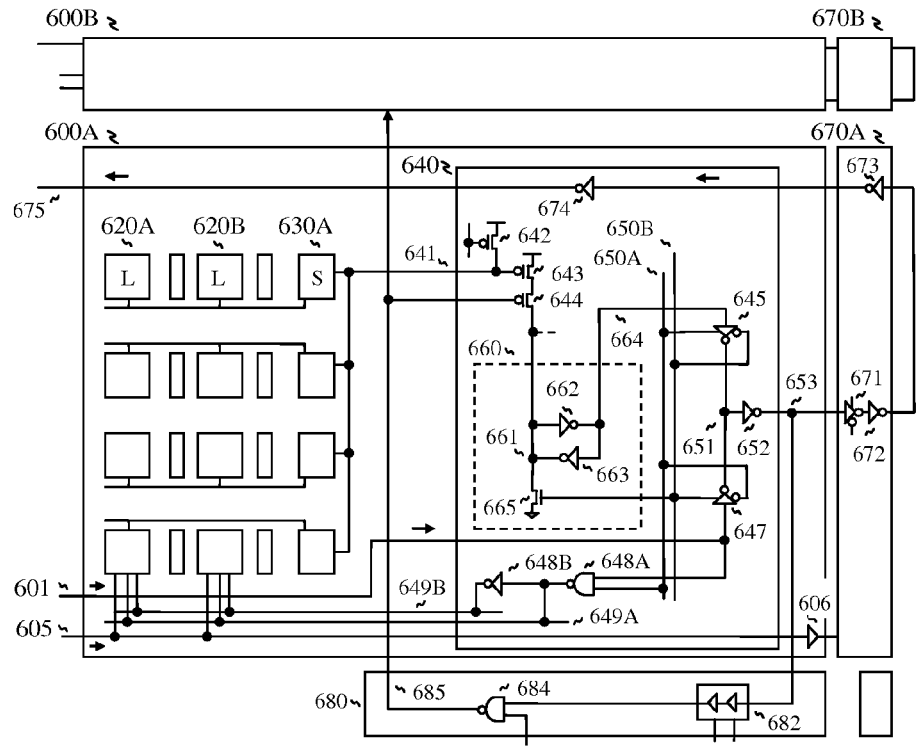
FIG. 6 illustrates alternative configuration for realizing page mode operation with low power, according to the teachings of the present invention.
FIG. 7A illustrates a tunable delay circuit.
FIG. 7B illustrates a delay unit of the tunable delay circuit.
FIG. 7C illustrates a related fuse circuit for the tunable delay circuit, according to the teachings of the present invention.

In FIG. 6, alternative configuration for realizing page mode operation with low power is illustrated, wherein a latch circuit 660 is composed of a cross coupled inverters 662 and 663 in the global sense amp 640 for storing an amplified output from the memory cell through the local sense amp and the segment sense amp. The latched data is transferred to a data output node 675 through a returning read path inside the memory array and another returning read path outside the memory array, so that the arriving time to the data output node is almost same regardless of location of the selected memory cell in row and column direction, which realizes very high density memory array. And this assumes that all the row decoders and the column decoders are also fully buffered for each block (not shown), such that the data path is fully buffered inside and outside the memory array. With this structure, one memory block can be simply repeated for designing huge memory array, which implements x8 and x16 input output organization, while the circuit in FIG. 2A is useful for configuring wide input and output organization, such as x128, x256 and x512 because there is no main column select signal 605 in bit line direction for the circuit in FIG. 2A.

When reading data "0" in the reference memory block 600A, a locking signal 685 from a signal generator 680 is generated by the latched data as a reference signal with a tunable delay circuit 682 (delay circuit is shown in FIG. 7A), so that the locking signal 685 locks all the latches before slow data are arrived. And the tunable delay circuit 682 generates an optimum delay time for compensating cell-to-cell and wafer-to-wafer variations as similar manner in FIG. 2A. In doing so, very high density memory with low power consumption is realized, because only selected columns are activated. Furthermore, the write path is decoded for reducing unnecessary charging/discharging current by enabling receiving gate 648A and inverting gate 648B, such that write data is reached to a selected block only while the second tri-state inverter 647 blocks the write data to be sent to unselected memory block.

For realizing page mode read operation, a stored data in a memory cell is transferred to the latch including two inverters 662 and 663 through local sense amp 620A or 620B, and the segment sense amp 630A, for instance. When the stored data is "0", an amplify transistor 643 in the global sense amp 640 is turned on by lowering the global bit line 641, while the pre-set transistor 642 is turned off. By lowering the global bit line 641, the latched output 661 is raised to high, because the cross coupled inverter latch 662 and 663 are much weaker than pull-up transistors 643 and 644. When the latch out 661 is raised to high, the other node 664 is lowered, so that the common node 651 is pulled up by the first tri-state inverter 645. By pulling up the common node 651, the read inverter 652 transfers low state to the data output node 675 through inverting buffers 671, 672, 673 and 674, when unselected tri-state inverter 671 in next memory block 670A is turned on to bypass the read output.

At the same time, the locking signal 685 is generated by NAND gate 684 receiving a read enable signal 681 and a delayed output from the tunable delay circuit 682, because a read enable signal 681 is asserted to high, which generates low output for enabling the PMOS read enable transistor 644. After then, the locking signal 685 is lowered by the tunable delay circuit 682 to disable the read enable transistor 644 for rejecting data "1", such that the tunable delay circuit 682 receives the read output from the read inverter 652 through the forwarding read line 653.

During standby, a positive latch node 661 is reset to low by turning on a pre-charge transistor 665, while the global amplify transistor 643 is turned off. And the second tri-state inverter 647 is turned off for the selected block by block select signals 650A (high) and 650B (low), which separates the forwarding read line 653 from the forwarding write line 601 which serves as a write path. In doing so, data "0" is transferred to data output node through the returning read path by asserting the page select signal 605 while data "1" keeps pre-charge state. And the page select signal 605 is buffered by a buffer 606 for driving next memory block 670A as well. Hence, low power operation is realized with buffered data path, but area is slightly increased with additional latch and decoding circuit, which is negligible portion.

For realizing page mode write operation, internal write data bus 649A and 649B is driven by a buffered write circuit 648A and 648B, wherein the buffered write circuit is enabled by the block select signal 650A (high). And the write transfer transistors (527 and 528 in FIG. 5) are also enabled to bypass a write data through the write bit line. When writing, the read enable signal 681 is de-asserted to low, so that the latched data in the cross coupled inverters 662 and 664 is not modified.

And there are various modifications and alternatives for configuring the multi-stage sense amps, in order to read data from the memory cell through the multi-divided bit line.

In FIG. 7A, more detailed tunable delay circuit (as shown 281 in FIG. 2A) is illustrated, wherein multiple delay units 701, 702 and 703 are connected in series, the first delay unit 701 receives input IN and generates output OUT, the second delay unit 702 is connected to the first delay unit, and the third delay unit 703 is connected to the second delay unit 702 and generates outputs 704 and 705, and so on. Each delay unit receives a fuse signal, such that the first delay unit receives F0, the second delay unit receives F1, and the third delay unit receives F2. And more detailed delay unit is illustrated in FIG. 7B, wherein the delay unit 710 receives an input IN0 and a fuse signal Fi, thus the fuse signal Fi selects output from the input IN0 or input DL1, so that a transfer gate 711 is turned on when the fuse signal Fi is low and output of inverter 715 is high, otherwise another transfer gate 715 is turned on when the fuse signal Fi is high and output of inverter 715 is low to bypass DL1 signal. Inverter chain 714 and 715 delays IN0 signal for the next delay unit, where more inverter chains or capacitors can be added for the delay even though the drawing illustrates only two inverters.

In FIG. 7C, a related fuse circuit of the tunable delay circuit (as shown in FIG. 7A) is illustrated in order to store information for the delay time, so that a fuse serves as a nonvolatile memory, wherein a fuse 721 is connected to a latch node 722, a cross coupled inverter latch including two inverters 725 and 726 are connected to the latch node 722, pull-down transistors 723 and 724 are connected serially to the latch node 722 for power-up reset. Transfer gate 730 is selected by a select signal 729 (high) and another select signal 728 (low) in order to bypass the latch node voltage 722 through inverter 725 and 727. In doing so, fuse data is transferred to output node Fi, otherwise test input Ti is transferred to Fi when a transmission gate 731 is turned on.

Figures 8A, 8B:
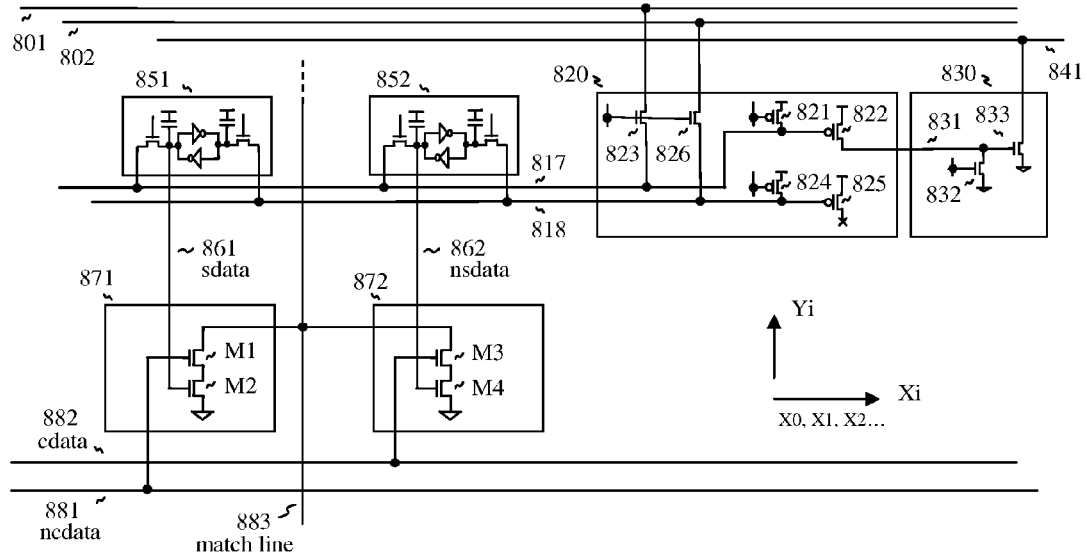
FIG. 8A illustrates an example application for content addressable memory.
FIG. 8B illustrates a truth table summarizing the logical relationships among various signals for the content addressable memory, according to the teachings of the present invention.

Additionally, in FIG. 8A, an example embodiment to implement CAM (content addressable memory) including multi-stage sense amps is illustrated. There are two memory cells 851 and 852, and two compare circuits 871 and 872 in a CAM cell. Read-write operation for the memory cells is the same as single port memory as explained above. And CAM operation is added in order to compare the stored data and the incoming data referred as comparand. In detail, a CAM is a storage device that is particularly suitable for matching functions because it can be instructed to compare a specific pattern of comparand data with data stored in an associative CAM array. A CAM can include a number of data storage locations, each of which can be accessed by a corresponding address. Functionality of a CAM depends at least in part on whether the CAM includes binary or ternary CAM cells. Ternary CAM cells are mask-per-bit CAM cells that effectively store three states of information, namely a logic "1" state, a logic "0" state, and a don't care state for compare operations.

Ternary CAM cells typically include a second memory cell that stores local mask data for the each ternary CAM cell. The local mask data masks the comparison result of the comparand data with the data stored in a first memory cell such that, when the mask bit has a first predetermined value (a logic "0", for example) its compare operation will be masked so that the comparison result does not affect the match line. The ternary CAM cell offers more flexibility to the user to determine on an entry-per-entry basis which bits in a word will be masked during a compare operation. However, the conventional SRAM cell based CAM is slow and big because transistors of the memory cell is wider than minimum feature size in order to drive heavy bit line during read, as published, U.S. Pat. No. 6,480,406. And DRAM based CAM requires refresh operation, as published, U.S. Pat. No. 6,331,961. Thus the invented SRAM is useful for the CAM application, which realizes high-speed and high-density CAM.

Detailed schematic is illustrated as shown in FIG. 8A. The memory cells 851 and 852 store data in the storage nodes 861 and 862, respectively, and the bit line 817 is connected to the memory cells. And the local sense amp 820 includes pre-charge transistors 821 and 824, local amplify transistors 822 and 825, and write transfer transistors 823 and 826 for writing data through write data bus 801 and 802. The segment sense amp 830 is connected to the local sense amp 820 through the segment bit line 831, wherein the segment sense amp 830 includes a reset transistor 832 and a segment amplify transistor 833, which is connected the global bit line 841. To read data, the local sense amp 820 receives voltage output from the memory cell through the bit line 817 while the inverting bit line 818 is not read, and the segment sense amp 830 receives voltage data from the local sense amp 820 through the segment bit line 831. To compare the stored data 861 and 862, and the incoming data 881 and 882, two compare circuits 871 and 872 including NMOS transistors M1 and M2, M3 and M4 are connected to a match line (ML) 883.

Referring now to FIG. 8B in view of FIG. 8A, a truth table is shown summarizing the behavior of CAM cell in relation to signal states maintained by various elements within CAM cell in accordance with the present invention, wherein the compare circuits are configured by the NMOS M1 to M4. Thus, the signal polarities of the internal nodes are non-inverted for controlling the match line ML 883. First column T21 lists binary states of "0" and "1" that can be stored in storage node 862 (namely nsdata) of the memory cell 852; second column T22 lists binary states of "0" and "1" that can be stored in storage node 861 (namely sdata) of the memory cell 851. Third column T23 lists the ternary states that can be maintained in one of the complement compare data lines, namely cdata which is the signal 882. Fourth column T24 lists the ternary states that can be maintained in the other complement compare data line, namely ncdata which is the signal 881. Fifth column T25 lists "low" and "high" as the two available voltage levels for match line 883. Finally, sixth column T26 lists "match" and "mismatch" as the two possible results for comparing states of ncdata line 881 and cdata line 882 with the states of CAM cell.

Row T31 indicates masked case where sdata 861 and nsdata 862 are "0" which makes match line to stay the precharge level at logic high, regardless of the compare data, such that the stored data "0" has ground potential which turns off NMOS compare circuit M2 and M4, rows T32-T33 both indicate that "0" state of CAM cell is represented by "0" of memory cell 851, and "1" of memory cell 852. In row T32, because state "1" of cdata line 882 does not match state "0" of CAM cell (sdata 861), M3 and M4 set up a current path for the match line ML so that the match line ML is driven "low" to indicate a mismatch of the data key and the stored value of CAM cell. In row T33, because state "0" of cdata line 882 matches state "0" of CAM cell (sdata 861), match line ML is driven "high" to indicate a partial match of the comparand and the stored value of CAM.

Rows T34-T35 both indicate that "1" state of CAM cell is represented by "1" of memory cell 851 and "0" of memory cell 852. In row T34, because state "1" of cdata line 882 matches state "1" of CAM cell (sdata 861), match line 883 ML is driven "high" to indicate a partial match of the comparand and the stored value of CAM cell. In row T35, because state "0" of cdata line 882 does not match state "1" of CAM cell (sdata 861), M1 and M2 set up a current path for the match line ML, so that the match line ML is driven "low" to indicate a mismatch of the comparand and the stored value of CAM cell.

Methods of Fabrication

The memory cells can be formed from single crystal silicon as the conventional SRAM cell. Alternatively, the memory cells can be formed from thin film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used. The LTPS has been developed for the low temperature process (around 500 centigrade) on the glass in order to apply the display panel, as published, U.S. Pat. No. 5,395,804, U.S. Pat. No. 6,852,577 and U.S. Pat. No. 6,951,793. Now the LTPS can be also used as a thin film polysilicon transistor for the memory device on the wafer. The thin film based transistors can drive multi-divided bit line which is lightly loaded, even though thin film polysilicon transistor can flow less current than single crystal silicon based transistor on the surface of the wafer, for example, around 10 times weaker than that of conventional transistor, as published, "Poly-Si Thin-Film Transistors: An Efficient and Low-Cost Option for Digital Operation", IEEE Transactions on Electron Devices, Vol. 54, No. 11, November, 2007, and "A Novel Blocking Technology for Improving the Short-Channel Effects in Polycrystalline Silicon TFT Devices", IEEE Transactions on Electron Devices, Vol. 54, No. 12, December, 2007. During LTPS process, the MOS transistor in the control circuit and routing metal are not degraded. Furthermore, the memory cell including the pass transistor and the cross coupled inverter latch can be formed from various semiconductor materials, such as silicon-germanium and germanium. And the steps in the process flow should be compatible with the current CMOS manufacturing environment as published, U.S. Pat. No. 6,670,642, U.S. Pat. No. 6,174,764 and U.S. Pat. No. 5,734,179 for forming SRAM. In this respect, detailed manufacturing processes for forming the memory cell, such as width, length, thickness, temperature, forming method, or any other material related data, are not described in the present invention.

An example memory cell layout is illustrated in FIGS. 9A to 9M, wherein both NMOS and PMOS transistors are formed from thin film layers. In FIG. 9A, metal-1 region 901 is illustrated, and contact-1 region 902 is depicted for connecting the metal-1 region 901 to body region of the thin film transistor (Detailed cross sectional view is illustrated as shown in FIG. 9L). In FIG. 9B, poly region is defined for forming thin film transistors, wherein poly region 911 is p-type and poly region 913 is n-type polysilicon after doping. For example, one of two poly regions is counter-doped with implant region 912. In FIG. 9C, poly gate region 915 is depicted, and p+ doping region 914 is illustrated for defining PMOS source and drain region. And in FIG. 9D, contact-2 region 919 is formed on the active region 911A and poly gate regions 915, 916, 917, and 918. In FIG. 9E, metal-1 region 921 is defined, and in FIG. 9F, lower plate region 923 of the capacitor is defined. The lower plate 923 is connected to the storage node 911A (in FIG. 9D) through contact-3 region 922 (in FIG. 9E) which includes ohmic contact portion to reduce contact resistance (not shown). In FIG. 9G, upper plate region 924 is formed on insulation layer (not shown) which is formed on the lower plate region 923. And the upper plate region 924 is connected to supply voltage 943 (in FIG. 9J) through contact-4 region 925. In FIG. 9H, contact-4 region is defined, such that contact-4 region 925 is illustrated to connect the supply voltage, and contact-4 region 926 is connected to one of bit lines 944 (in FIG. 9J) through metal-3 region and contact-5 region 932 (in FIG. 9I). And in FIG. 9I, metal-3 region is defined, such that the word line 931 is connected to poly gate 915 and 918 (in FIG. 9D) through contact-4 region 927 (in FIG. 9H) and metal-2 region (in FIG. 9E). In FIG. 9J, metal-4 regions are defined, such that metal-4 region 941 and 945 provide VSS voltage, metal-4 region 943 provides VDD voltage, and metal-4 regions 942 and 944 serve as a pair of bit lines.

In FIG. 9K, base layers including active region and poly gate region are illustrated again for marking an arrow "A" (in FIG. 9L) which shows a cross sectional view of the memory cell 900. In FIG. 9L, metal-1 region 901 is formed on the substrate 999 for connecting to body region of thin film transistor through the contact-1 (a poly plug) 902, where drain region 911A (in FIG. 9D) serves as the storage node which is connected to the lower plate region 923 through contact-2 region 922. Poly gate (word line) region 918 is formed on gate oxide region to form NMOS TFT transistor. After forming poly gate, lower plate 923 is formed. And then, the insulation layer 923A is deposited, and the upper plate 924 is formed on the insulation layer 923A. After then, metal-3 region 931 is formed on the upper plate region. In doing so, the capacitor is formed in between the metal-2 region and the metal-3 region, and the capacitor does not increase the cell size. Finally, metal-4 region 941 is formed. In particular, the memory cell 900 can be composed of body-tied TFT transistors, as shown in FIG. 9L, so that the body-tied TFT effectively alleviate self-heating problem in small geometry TFT, where the body of TFT transistor is always reverse biased. Hence, no current can flow through the reverse biased body except leakage current.

In FIG. 9M, multi-stacked memory cell is illustrated, wherein a first floor memory cell 950 is formed on the substrate with conventional bulk transistor, and a second floor memory cell 960 is formed on the first floor with body-tied TFT, where memory cell structure is same as that of FIGS. 9A to 9K. Lower bit line 951 and upper bit line 961 are connected to a metal-1 line 959 through contact regions, as an example, so that word lines are separately selected but there is no need of column decoding with same bit line. Lower word line WL1 is illustrated in the floor 950 and upper word line WL2 is illustrated in the second floor 960. When fabricating the memory cell, body contact region 967 may be misaligned but the plug portion is same p-type as the body region. Thus, the source/drain is not shorted to metal-1 region as long as the poly plug depth is optimized in order to maintain a reverse bias region. And shallow trench isolation (STI) 998 is formed for isolating transistors on the substrate 999. And an arrow "A" illustrates a direction for the cross sectional view in the first floor 950 in FIG. 9M, where the arrow "A" is shown in FIG. 9K on the base layers.

Figure 9N:
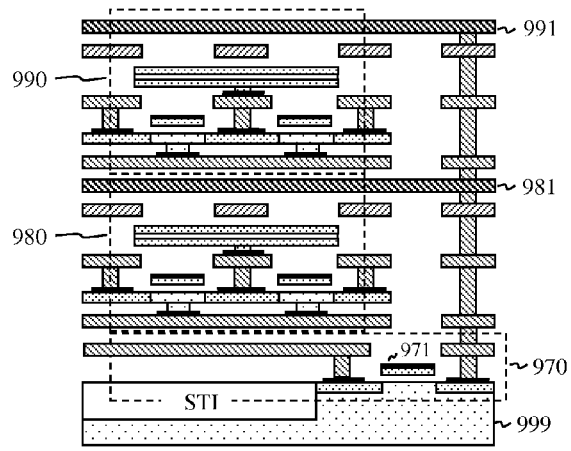
FIG. 9N illustrates multi-stacked memory cell on a peripheral circuit, according to the teachings of the present invention.

In FIG. 9N, multi-stacked memory cell on a peripheral circuit is illustrated, wherein the peripheral circuit 970 is formed on the substrate 999, memory cell 980 in the second floor is formed on the peripheral circuit 970 and another memory cell 990 in the third floor is formed on the memory cell 980. The bit line 991 in the third floor is connected to the bit line 981 in the second floor, and the bit line 981 is connected to the peripheral circuit 970 through metal and contact layers, where the memory cell structure is the same as that of FIG. 9M.

Figure 10A:
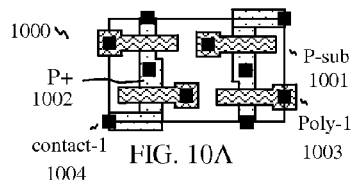
FIG. 10A, 10B, 10C, 10D, 10E, 10F, 10G, 10H, 10I, 10J, 10K and 10L illustrate an example of memory cell layout.
Figure 10E:
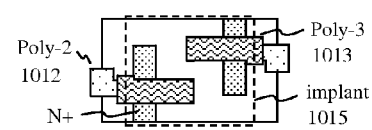
Figure 10I:
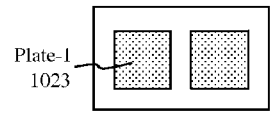
Figure 10B:
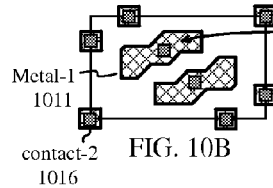
Figure 10F:
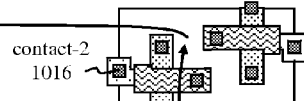
Figure 10J:
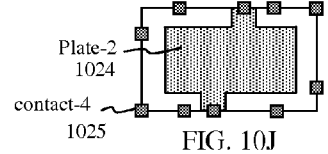
Figure 10C:
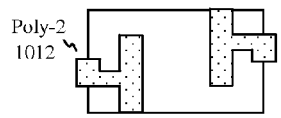
Figure 10G:
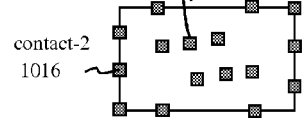
Figure 10K:
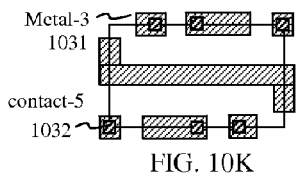
Figure 10D:
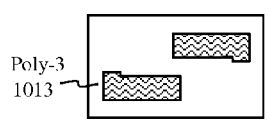
Figure 10H:
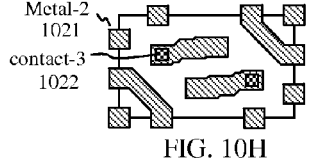
Figure 10L:
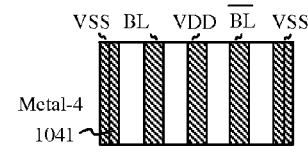
Figure 10M:
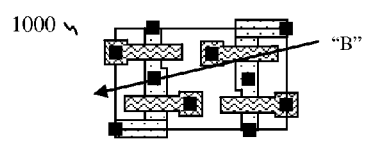
FIG. 10M illustrates base layers for explaining a cross sectional view of the related memory cell.
Figure 10O:
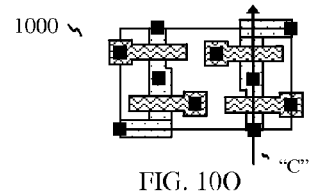
FIG. 10O illustrates base layers for explaining a cross sectional view of the related memory cell.
Figure 10N:
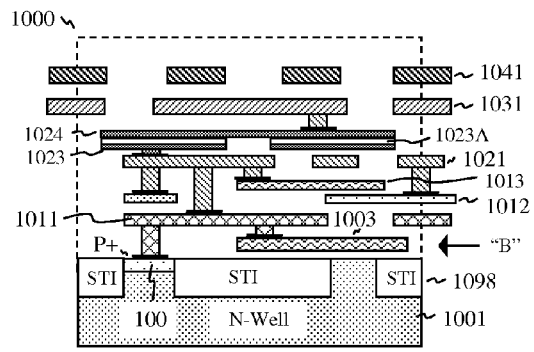
FIG. 10N illustrates a cross sectional view of the related memory cell.
Figure 10P:
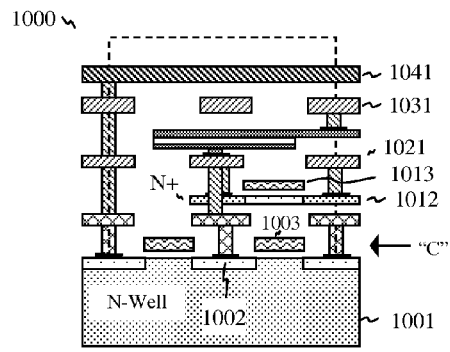
FIG. 10P illustrates a cross sectional view of the related memory cell with body-tied TFT, according to the teachings of the present invention.

In FIG. 10A to 10P, an example of memory cell layout including body-tied TFT as pull-up transistor cell is illustrated, where minimum or near minimum feature sizes can be used to reduce cell area because the memory cell drives only lightly loaded bit line. In one embodiment, NMOS pull-down transistors are formed from thin film polysilicon layer for stacking the pull-down transistor, so that it is called half-stacked memory cell. In addition, the body-tied TFT (thin film transistor) is used for forming the pull-down transistor, in order to alleviate self heating problem of the short channel thin film transistor, because body of TFT is always reverse-biased. To do so, ground voltage (VSS) is applied to the p-type body of the NMOS TFT for the pull-down thin film transistors. Advantage of using NMOS TFT as a pull-down transistor is that it gives more balanced beta ratio (pull-down strength versus pull-up strength), such as, 1/14 vs. 1/2.5, which realizes beta ratio 1:5.6, while NMOS TFT is 1/14 of strength with thin film transistor (with slower mobility of poly silicon, ~100 cm²/Vs) and PMOS regular transistor is 1/2.5 strength typically, compared to n-type single crystal silicon ~1400 cm²/Vs. Furthermore, PMOS pass transistor can be used because PMOS pull-up transistor is still stronger than that of NMOS TFT pull-down transistor. For using PMOS pass transistor, length of the local bit line is around half of the equivalent one as explained above for compensating charging and discharging speed. And the stacked capacitor is also used to increase dynamic stability, such that the capacitor absorbs charges from the bit line when reading and writing. With this half-stacked memory cell, ground pre-charge is available for the local bit line pair, so that strong single crystal silicon PMOS transistors achieves fast access while weak NMOS TFT is used for storing the charges and a stacked capacitor can help to read for quick charging the local bit line optionally.

In FIG. 10A, a memory cell 1000 is depicted, wherein p+ active region 1002 is formed on n-well region 1001, poly gate region 1003 is formed on the p+ active region 1002 for fabricating PMOS pass transistor, and then contact-1 region 1004 is formed. And in FIG. 10B, metal-1 region 1011 is defined, and contact-2 region 1016 is formed on the metal-1 region, where contact-2 region 1016 is actually defined in FIG. 10G after forming thin film pull-down NMOS transistors, which will be explained as below. In FIG. 10C, poly-2 region 1012 is formed as active region. In FIG. 10D, poly-3 region 1013 as gate region is formed. In FIG. 10E, a combined layout including poly-2 and poly-3 is illustrated for ease of understanding, and n+ implant layer 1015 is defined for injecting impurities to n+ active region 1014, so that NMOS pull-down transistors are formed inside the implant region 1015. In FIG. 10F, contact-2 region 1016 is depicted on the metal-1 region and the thin film transistors for connecting internal nodes with metal-2 region in FIG. 10H. In particular, contact-2 region 1016A for connecting metal-1 (FIG. 10B) and metal-2 (FIG. 10H) is defined, and which region 1016A is tighter than other area, but adjacent layers including n+ active region and poly-3 region are same potential. And more detailed vertical contact-2 region is illustrated as below in FIG. 10N. And in FIG. 10G, contact-2 region 1016 is illustrated again for ease of understanding, such that metal-2 region 1021 in FIG. 10H covers the contact-2 region 1016.

In FIG. 10I, lower plate 1023 is defined for configuring a capacitor of the memory cell, and the lower plate 1023 is connected to the storage nodes through contact-3 region 1022 (in FIG. 10H) which includes ohmic contact portion to reduce contact resistance (not shown). In FIG. 10J, upper plate 1024 for the capacitor is formed on insulation layer (not shown) which is formed on the lower plate region 1023. And contact-4 region 1025 in FIG. 10J is defined. And in FIG. 10K, metal-3 region 1031 is defined, so that metal-3 region 1031 covers contact-4 region 1025. And contact-5 region 1032 is defined. In FIG. 10L, metal-4 region 1041 is defined, so that metal-4 region 1041 covers contact-5 region 1032.

In FIG. 10M, base layers including active region and poly gate region are illustrated again for marking an arrow "B" which shows a cross sectional view of the memory cell 1000 as shown in FIG. 10N. From the bottom region, p+ active region 1002 is formed on n-well region 1001, poly gate 1003 is formed on gate oxide, and metal-1 region 1011 is used to connected p+ active region 1002 and poly gate region 1003. And the active region 1002 is isolated by STI (shallow trench isolation). After then, thin film transistor as a pull-down transistor is formed, wherein poly-2 region 1012 serves as p-type body, poly-3 region 1013 serves as a gate, and the p-type body region 1012 is connected to metal-2 region 1021 serving as an upper routing line for biasing ground voltage. Hence, the body region 1012 is always reverse biased, and the body-tied structure prevents self heating problem in short channel thin film transistor. After forming transistors, the capacitor is formed, such that the lower plate 1023 is formed on the metal-2 region 1021, and the upper plate 1024 is formed on insulation region 1023A. Then, metal-3 region 1031 and metal-4 region 1041 are formed for connecting internal nodes and external nodes. In FIG. 10O, the base layers are illustrated again for marking an arrow "C" which shows a cross sectional view of the memory cell 1000 as shown in FIG. 10P, wherein all layer numbers are the same as FIG. 10N.

And as shown in FIGS. 10N and 10P, the capacitor is formed in between the metal-2 region 1021 and the metal-3 region 1031. Hence, the capacitor does not increase the cell size. Furthermore, forming the capacitor does not affect the MOS transistors under the capacitor with low temperature polysilicon as explained above. And PIP (Polysilicon Insulator Polysilicon) capacitor structure and MIM (Metal Insulator Metal) capacitor structure can be used for forming the capacitor. Forming PIP capacitor and MIM capacitor is similar to the conventional method as published, "MIM Capacitor Integration for Mixed-Signal/RF Applications", IEEE Transactions on Electron Devices, Vol. 52, No. 7, June 2005. The capacitance value is determined by the thickness and insulation material. Furthermore, various materials can be used as the insulator of the capacitor, such as silicon dioxide, silicon nitride, Ta2O5, TiO2, Al2O3, TiN/HfO2/TiN(TIT), and Ru/Insulator/TiN(RIT).

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
   a memory cell including a pass transistor pair and a cross coupled inverter latch; and
   a first dynamic circuit serving as a local sense amp connecting to the memory cell through two local bit lines, wherein the first dynamic circuit includes a pre-charge transistor pair for pre-charging the two local bit lines, a local amplify transistor for reading an output from one of the two local bit lines, where the local amplify transistor is serially connected to a local select transistor, and a write transistor pair for connecting the two local bit lines to a write bit line pair; and
   a second dynamic circuit serving as a segment sense amp connecting to the local select transistor through a segment bit line, wherein the second dynamic circuit is composed of a reset transistor for resetting the segment bit line, a segment amplify transistor for reading the segment bit line where the segment amplify transistor is serially connected to a segment select transistor; and
   a first tri-state inverter serving as an inverting amplifier of a global sense amp connecting to the segment select transistor through a global bit line, wherein the global sense amp includes a read circuit, a data transfer circuit, a returning buffer and a write circuit; and the read circuit includes the first tri-state inverter for reading the global bit line and a pre-set transistor for pre-setting the global bit line; and the data transfer circuit includes a second tri-state inverter for bypassing a write data and a read inverter for reading a common node which is connected to the first tri-state inverter and the second tri-state inverter; and the write circuit receives the write data and drives the write bit line pair; and the returning buffer receives a read output from the read inverter through a returning read path; and
   for reducing turn-off current, the local amplify transistor is composed of longer channel length transistor than that of the reset transistor of the segment sense amp, and the segment amplify transistor is composed of longer channel length transistor than that of the pre-set transistor of the global sense amp; and
   an output latch circuit receiving and storing an output from the returning buffer; and
   a latch control circuit generating a locking signal which is generated by a reference signal based on at least a reference memory cell, in order to lock the output latch circuit.

2. The memory device of claim 1, wherein the local amplify transistor is composed of equal channel length transistor to that of the reset transistor of the segment sense amp, and the segment amplify transistor is composed of equal channel length transistor to that of the pre-set transistor of the global sense amp.

3. The memory device of claim 1, wherein the pre-charge transistor pair of the local sense amp, the reset transistor of the segment sense amp and the pre-set transistor of the global sense amp are composed of low threshold MOS transistor.

4. The memory device of claim 1, wherein the local sense amp includes two series connected transistors for serving as a write switch pair for writing data to the memory cell through the two local bit lines, the pre-charge transistor pair for pre-charging the two local bit lines, and the local amplify transistor for reading an output from one of the two local bit lines, where the local amplify transistor is serially connected to the local select transistor.

5. The memory device of claim 1, wherein the read circuit is composed of a clocked NAND gate and the pre-transistor pair, such that the clocked NAND gate is connected to a first global bit line and a second global bit line, and the pre-set transistor pair is used for pre-setting the first global bit line and the second global bit line.

6. The memory device of claim 1, wherein the read circuit is composed of a global amplify circuit, a latch circuit and the first tri-state inverter, such that the global amplify circuit includes a global amplify transistor for reading the global bit line and the pre-set transistor for pre-setting the global bit line, and a global select transistor for enabling the global amplify transistor; the latch circuit is connected to the global select transistor; the first tri-state inverter includes an input which is connected to the latch circuit and an output which is connected to the read inverter of the bypass circuit through the common node; and the latch circuit is reset by a latch reset transistor.

7. The memory device of claim 1, wherein the read circuit is composed of a global amplify circuit, a latch circuit and the first tri-state inverter, such that the global amplify circuit includes a global amplify transistor for reading the global bit line and the pre-set transistor for pre-setting the global bit line, and a global select transistor for enabling the global amplify transistor; the latch circuit is connected to the global select transistor; the first tri-state inverter includes an input which is connected to the latch circuit and an output which is connected to the read inverter of the bypass circuit through the common node; and the latch circuit is reset by a latch reset transistor; and the global select transistor is controlled by the locking signal which is generated by a tunable delay circuit receiving the read output of the read inverter.

8. The memory device of claim 1, wherein the latch control circuit receives a read enable signal from a control circuit and generates the locking signal to lock the output latch circuit.

9. The memory device of claim 1, wherein the latch control circuit includes a tunable delay circuit, such that the tunable delay circuit receives multiple reference signals which are generated by multiple reference memory cells; and the tunable delay circuit generates the locking signal by delaying at least one reference signal from the multiple reference signals; and tuning information for the tunable delay circuit is stored in a nonvolatile memory.

10. The memory device of claim 1, wherein the two local bit lines are pre-charged to supply voltage; and alternatively, the two local bit lines are pre-charged to ground voltage.

11. The memory device of claim 1, wherein the pass transistor pair of the memory cell is formed from thin film transistors and body of the thin film transistors is connected to a biasing line.

12. The memory device of claim 1, wherein the pass transistor pair of the memory cell is formed from single crystalline silicon or poly crystalline silicon.

13. The memory device of claim 1, wherein the pass transistor pair of the memory cell is formed from silicon-germanium.

14. The memory device of claim 1, wherein the pass transistor pair of the memory cell is formed from germanium.

15. The memory device of claim 1, wherein the memory cell includes the pass transistor pair and the cross coupled inverter latch; and additionally a capacitor pair is connected to the pass transistor pair and the cross coupled inverter latch; and the capacitor pair includes multiple layer capacitor, such as PIP (polysilicon-insulator-polysilicon) capacitor and MIM (metal-insulator-metal) capacitor.

16. The memory device of claim 1, wherein the memory cell includes the pass transistor pair and the cross coupled inverter latch; and additionally a capacitor pair is connected to the pass transistor pair and the cross coupled inverter latch; and the capacitor pair of the memory cell is formed from various dielectric material, such as silicon dioxide, silicon nitride, Ta2O5, TiO2, Al2O3, TiN/HfO2/TiN(TIT), and Ru/Insulator/TiN(RIT).

17. The memory device of claim 1, wherein the cross coupled inverter latch of the memory cell includes two inverters; and each inverter is composed of a PMOS pull-up transistor and an NMOS pull-down transistor, where the NMOS pull-down transistor is formed from a thin film transistor and body of the thin film transistor is connected to ground voltage.

18. The memory device of claim 1, wherein the memory cell is stacked over peripheral circuits.

19. The memory device of claim 1, wherein the memory cell is stacked over another memory cell.

20. The memory device of claim 1, additionally comprising at least one compare circuit to configure a content addressable memory; and the compare circuit includes a first transistor set and a second transistor set, wherein a first signal set couples to control a conduction state of the first transistor set and a second signal set couples to control a conduction state of the second transistor set, wherein the first signal set includes stored data in the memory cell and the second signal set includes comparand data from an input device; and at least one compare circuit coupled among the memory cells and at least one match line to receive the first and second signal sets and affect a logical state of the match line, in response to a predetermined logical relationship between the first and second signal sets.

* * * * *